(12) United States Patent
Li et al.

(10) Patent No.: US 11,932,966 B2
(45) Date of Patent: Mar. 19, 2024

(54) METAL SULFIDE FILLED CARBON NANOTUBES AND SYNTHESIS METHODS THEREOF

(71) Applicants: Wenzhi Li, Palmetto Bay, FL (US); Yuba Poudel, Miami, FL (US)

(72) Inventors: Wenzhi Li, Palmetto Bay, FL (US); Yuba Poudel, Miami, FL (US)

(73) Assignee: THE FLORIDA INTERNATIONAL UNIVERSITY BOARD OF TRUSTEES, Miami, FL (US)

( * ) Notice: Subject to any disclaimer, the term of this patent is extended or adjusted under 35 U.S.C. 154(b) by 0 days.

(21) Appl. No.: 18/151,309

(22) Filed: Jan. 6, 2023

(65) Prior Publication Data
US 2023/0203712 A1 Jun. 29, 2023

Related U.S. Application Data

(62) Division of application No. 16/850,687, filed on Apr. 16, 2020, now Pat. No. 11,572,636.

(51) Int. Cl.
| | |
|---|---|
| *C30B 29/66* | (2006.01) |
| *C01B 32/162* | (2017.01) |
| *C01B 32/178* | (2017.01) |
| *C23C 16/26* | (2006.01) |
| *C30B 25/18* | (2006.01) |
| *C30B 29/46* | (2006.01) |

(52) U.S. Cl.
CPC .......... *C30B 29/66* (2013.01); *C01B 32/162* (2017.08); *C01B 32/178* (2017.08); *C23C 16/26* (2013.01); *C30B 25/186* (2013.01); *C30B 29/46* (2013.01); *C01B 2202/06* (2013.01); *C01B 2202/10* (2013.01); *C01P 2002/72* (2013.01); *C01P 2002/82* (2013.01); *C01P 2002/84* (2013.01); *C01P 2004/03* (2013.01); *C01P 2004/04* (2013.01)

(58) Field of Classification Search
CPC ... C30B 29/46; C01B 32/178; C01B 2202/06; C01B 2202/10
USPC ........................................................ 428/375
See application file for complete search history.

(56) References Cited

U.S. PATENT DOCUMENTS

| | | |
|---|---|---|
| 7,157,068 B2 | 1/2007 | Li et al. |
| 10,453,583 B2 | 10/2019 | Patel et al. |

FOREIGN PATENT DOCUMENTS

| | | | | |
|---|---|---|---|---|
| CN | 106881116 A | * | 6/2017 | ............ B01J 27/051 |
| JP | 3988037 B2 | * | 10/2007 | |
| WO | WO-2019089706 A1 | * | 5/2019 | |

OTHER PUBLICATIONS

Zhou "Single-Step Synthesis of Cobalt Sulfide Nanowires Encapsulated in Carbon Nanotubes." J. Nanosci. Nanotechnol. 2013, vol. 13, No. 10 (Year: 2013).*

(Continued)

*Primary Examiner* — Tri V Nguyen
(74) *Attorney, Agent, or Firm* — Saliwanchik, Lloyd & Eisenschenk

(57) ABSTRACT

Filled carbon nanotubes (CNTs) and methods of synthesizing the same are provided. An in situ chemical vapor deposition technique can be used to synthesize CNTs filled with metal sulfide nanowires. The CNTs can be completely and continuously filled with the metal sulfide fillers up to several micrometers in length. The filled CNTs can be easily collected from the substrates used for synthesis using a simple ultrasonication method.

20 Claims, 11 Drawing Sheets

(56) References Cited

OTHER PUBLICATIONS

Gaohui Du et al., Filling Carbon Nanotubes with Co9S8 Nanowires through in Situ Catalyst Transition and Extrusion, J. Phys. Chem. C 2008, 112, 1890-1895.

Qingmei Su et al., In Situ Transmission Electron Microscopy Investigation of the Electrochemical Lithiation—Delithiation of Individual Co9S8/Co-Filled Carbon Nanotubes, www.acsnano.org, vol. 7, No. 12, 2013, 11379-11387.

R. Kozhuharova et al., Synthesis and characterization of aligned Fe-filled carbon nanotubes on silicon substrates, Journal of Materials Science: Materials in Electronics 14 (2003) 789-791.

Qingmei Su et al., In Situ Synthesis of Iron/Nickel Sulfide Nanostructures-Filled Carbon Nanotubes and Their Electromagnetic and Microwave-Absorbing Properties, The Journal of Physical Chemistry, 2011, 115, 1838-1842.

Wang-Jing Yu et al., Synthesis and Electrochemical Lithium Storage Behavior of Carbon Nanotubes Filled with Iron Sulfide Nanoparticles, Advanced Science, 2016, 3, 1600113.

Shuoyu Li et al., Self-Climbed Amorphous Carbon Nanotubes Filled with Transition Metal Oxide Nanoparticles for Large Rate and Long Lifespan Anode Materials in Lithium Ion Batteries, American Chemical Society, ACS Appl. Mater. Interfaces 2017, 9, 26818-26825.

Jinqing Hu et al., Carbon Nanotubes as Nanoreactors for Fabrication of Single-Crystalline Mg3N2 Nanowires, Nano Letters, 2006 vol. 6, No. 6, 1136-1140.

Wan-Jing Yu et al., Lithiation of Silicon Nanoparticles Confined in Carbon Nanotubes, ACS Nano, vol. 9, No. 5, 2015, 5063-5071.

M. Monthioux et al., Hybrid carbon nanotubes: Strategy, progress, and perspectives, J. Mater. Res., vol. 21, No. 11, Nov. 2006.

Yuba Raj Poudel et al., Synthesis, properties, and applications of carbon nanotubes filled with foreign materials: a review, Materials Today Physics 7 (2018) 7-34.

Muller et al., Growth Aspects of Iron-Filled Carbon Nanotubes Obtained by Catalytic Chemical Vapor Deposition of Ferrocene; J. Phys. Chem. C, vol. 113, No. 7, pp. 2746-2740, 2009.

* cited by examiner

METAL SULFIDE FILLED CARBON NANOTUBES AND SYNTHESIS METHODS THEREOF

CROSS-REFERENCE TO RELATED APPLICATION

The present application is a divisional application of U.S. application Ser. No. 16/850,687, filed Apr. 16, 2020, the disclosure of which is hereby incorporated by reference in its entirety, including all figures, tables, and drawings.

GOVERNMENT SUPPORT

This invention was made with government support under DMR1506640 awarded by the National Science Foundation. The government has certain rights in the invention.

BACKGROUND

Carbon nanotubes (CNTs) are the allotropes of carbon that are formed by rolling up an individual or several graphitic layers in a concentric fashion. The conversion of a two-dimensional graphene layer into a one-dimensional tubular structure having a diameter in a nanoscale and length of several micrometers gives rise to new physical properties in CNTs. For example, an individual CNT can either have characteristics that are metallic or semiconducting depending upon its diameter and helicity, which makes its electronic properties different from that of semi-metallic graphene/graphite. Since their discovery, CNTs have drawn much attention because of their unique electronic, mechanical, and thermal properties making them attractive for several physical applications.

Besides the fundamental physical properties of CNTs, their unique hollow tubular structure allows the storage of foreign materials in the CNT core to bring about a novel class of hybrid nanomaterials. These hybrid nanomaterials (or nanohybrids) can be thought as nano-capsules or nano-cocoons formed with one or several cylindrical carbon shells encapsulating a foreign material usually in form of nanoparticles (NPs), nanorods, or nanowires. The insertion of guest materials in the hollow nanochannels of CNTs can integrate the properties of host CNTs and guest fillers simultaneously, thereby resulting in distinctive physical properties that are different from that of either the empty CNTs or the filling materials. The synergistic effects of carbon shells and the guest fillers distinguish the filled CNTs as novel nanohybrids with unusual electrical, magnetic, electromagnetic, electrochemical, and optical properties. These new properties of filled CNTs can expand their applications in various devices such as lithium-ion batteries (LIBs), microwave absorbers, biosensors/chemosensors, data storage units, drug delivery systems, nanothermometers, nanofilters, and memory devices. The filling process also serves as a route towards the generation of different kinds of nanowires (e.g., metallic, semiconducting, magnetic) that have inspired much interest because of their low dimensions, enlarged surface-to-volume ratio, and quantum confinement effects.

BRIEF SUMMARY

Embodiments of the subject invention provide novel and advantageous filled carbon nanotubes (CNTs) and methods of synthesizing the same. In situ methods (e.g., chemical vapor deposition techniques) can be used to synthesize CNTs (e.g., multi-walled CNTs) filled with metal sulfide (e.g., nickel sulfide, iron sulfide, cobalt sulfide) nanowires. The CNTs can be completely (or nearly completely) and continuously (or nearly continuously) filled with the metal sulfide fillers (e.g., metal sulfide nanowires, such as single crystalline nanowires) up to several micrometers (or several tens of micrometers) in length. The filled CNTs can be easily collected from the substrate(s) used for synthesis using a simple ultrasonication method, and the same substrate(s) can be reused to synthesize filled CNTs again.

In an embodiment, a method of synthesizing filled CNTs can comprise: providing a substrate in a reaction chamber; disposing a catalyst comprising a metal on the substrate; providing a sulfur-containing organic compound to the reaction chamber; and performing a chemical vapor deposition technique to simultaneously grow CNTs (e.g., multi-walled CNTs) and fill the CNTs with a metal sulfide comprising the metal, thereby synthesizing the filled CNTs filled with the metal sulfide. The CNTs can have an average filling ratio (the proportion of the CNT that is filled as a fraction of the total CNT) of the metal sulfide of at least 0.90, or even at least 0.99. The metal can be, for example, nickel, cobalt, or iron (e.g., the metal can be nickel and the metal sulfide can be $Ni_3S_2$). The substrate can be, for example, silicon or a foam (e.g., a foam comprising the metal). The sulfur-containing organic compound can be, for example, thiophene or dimethyl sulfide. The providing of the sulfur-containing organic compound to the reaction chamber can comprise: providing a supply of the sulfur-containing organic compound outside the reaction chamber; and sending a gas through the supply of the sulfur-containing organic compound and into the reaction chamber such that the sulfur-containing organic compound is bubbled into the reaction chamber with the gas. The method can further comprise collecting the filled CNTs via ultrasonication, and may further comprise using a magnet to purify the filled CNTs during the collecting, after the collecting, or both. The reaction chamber can comprise, for example, a tube of a first material (e.g., quartz) with a boat (e.g., of the first material) disposed therein, and the boat can comprise a surface to which the substrate is provided. The method can also further comprise, after collecting the filled CNTs, reusing the substrate to synthesize further filled CNTs (e.g., by repeating the synthesis steps described herein). In addition, the method can further comprise, before disposing the catalyst on the substrate, cleaning the substrate via ultrasonication using at least one solvent (e.g., by performing three successive ultrasonication processes using deionized water, acetone, and isopropyl alcohol, respectively).

In a further embodiment, the catalyst can be a salt of the metal, and the method can further comprise: before providing the sulfur-containing organic compound to the reaction chamber, heating the reaction chamber to a first predetermined temperature (e.g., 600° C.) for a first predetermined amount of time (e.g., 30 minutes) to oxidize the catalyst; after oxidizing the catalyst, flowing an inert gas through the reaction chamber and passing hydrogen gas through the reaction chamber to reduce the catalyst; and after reducing the catalyst, stopping the flowing of the hydrogen gas through the reaction chamber while continuing to flow the inert gas through the reaction chamber while heating the reaction chamber to a second predetermined temperature (e.g., in a range of 1000° C.-1200° C.). The disposing of the catalyst on the substrate can comprise: preparing a catalyst solution by mixing a powder of the salt of the metal in a solvent; providing the catalyst solution to the substrate; and performing a two-stage spin coating to form a uniform coating of the catalyst on a surface of the substrate. The catalyst solution can have a concentration of the salt of the metal in a range of 0.02 molar (M) to 0.06 M.

In a further embodiment, the catalyst can be nanoparticles of the metal, and the method can further comprise: before disposing the catalyst on the substrate, dispersing the nanoparticles in a solvent and putting the solvent in an ultrasonication bath to achieve a uniform suspension of the nanoparticles in the solvent; dip coating at least a portion of the substrate by immersing the at least a portion of the substrate in a container having the suspension of the nanoparticles in the solvent and gently shaking the container; and transferring the at least a portion of the substrate to a heating apparatus (e.g., a hot plate) and heating (at a temperature of, e.g., 150° C. for, e.g., 5 minutes) the at least a portion of the substrate to evaporate the solvent. The substrate can be a foam comprising the metal (e.g., nickel foam).

In another embodiment, a compound can comprise: a CNT (e.g., a multi-walled CNT); and a nanowire of a metal sulfide filled in the CNT. The CNT can have a filling ratio of the metal sulfide of at least 0.90 (or even 0.99), and the CNT can have a length of at least 5 µm. The CNT filled with the nanowire can be straight from one end (i.e., a first end thereof) to the other end (i.e., a second end thereof). Each of the first end and the second end of the multi-walled CNT filled with the nanowire can be closed with carbon shells. The metal sulfide can be, for example, nickel sulfide, cobalt sulfide, or iron sulfide (e.g., the metal sulfide can be $Ni_3S_2$, $Co_9S_8$, or $Fe_xS_y$).

DETAILED DESCRIPTION

Figure 1:
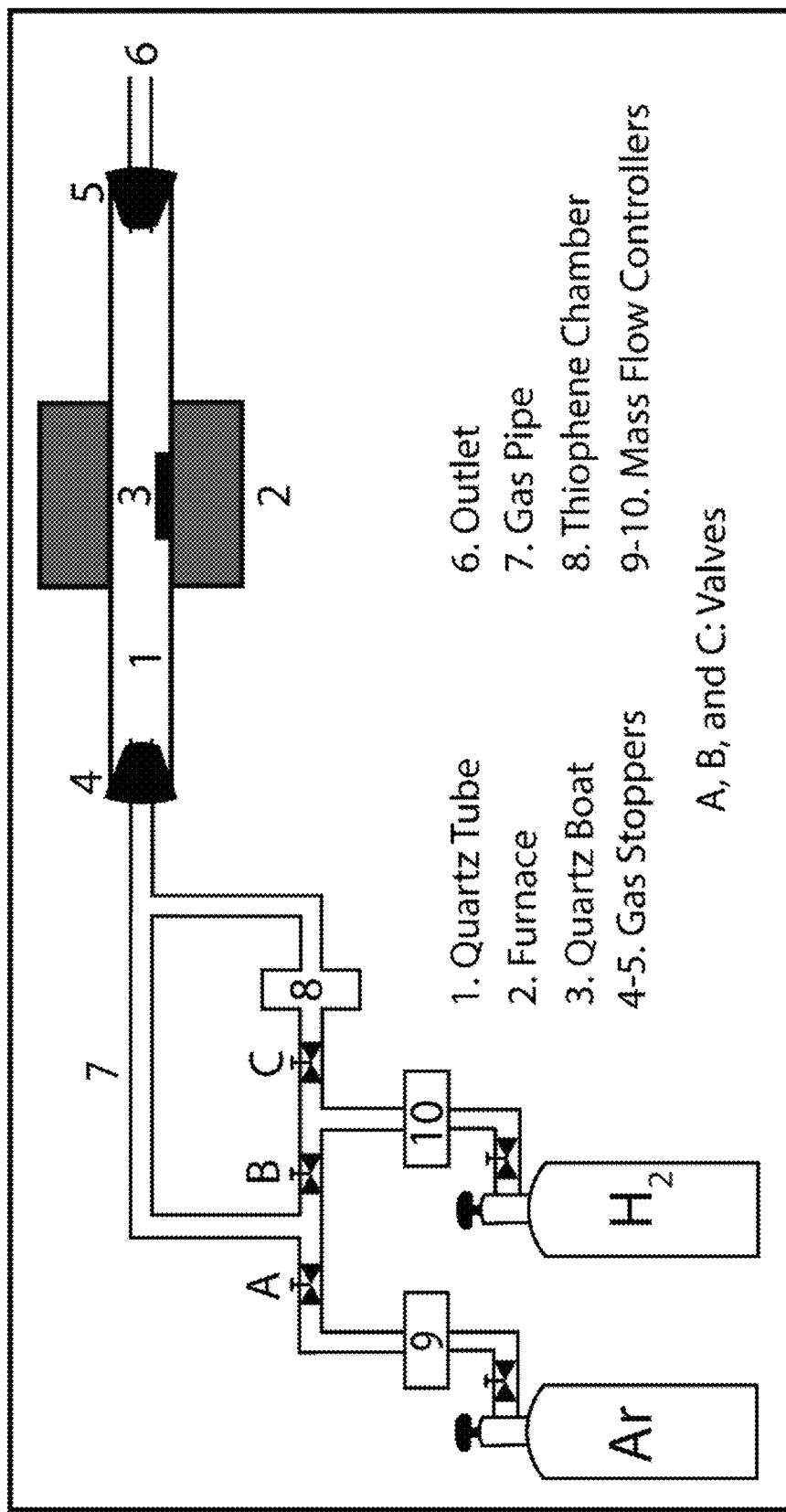
FIG. 1 is a schematic view of a setup for in situ synthesis of filled carbon nanotubes (CNTs) using a chemical vapor deposition technique, according to an embodiment of the subject invention.

Embodiments of the subject invention provide novel and advantageous filled carbon nanotubes (CNTs) and methods of synthesizing the same. In situ methods (e.g., chemical vapor deposition techniques) can be used to synthesize CNTs (e.g., multi-walled CNTs or single-walled CNTs) filled with metal sulfide (e.g., nickel sulfide, iron sulfide, cobalt sulfide) nanowires. The CNTs can be completely (or nearly completely) and continuously (or nearly continuously) filled with the metal sulfide fillers (e.g., metal sulfide nanowires, such as single crystalline nanowires) up to several micrometers (or several tens of micrometers) in length. The filled CNTs can be easily collected from the substrate(s) used for synthesis using a simple ultrasonication method, and the same substrate(s) can be reused to synthesize filled CNTs again.

Sulfur-containing compounds, such as sulfur-containing hydrocarbon compounds (e.g., thiophene or dimethyl sulfide) can be used to synthesize filled CNTs (e.g., metal sulfide filled CNTs). Metal nanoparticles (e.g., nickel nanoparticles, cobalt nanoparticles, or iron nanoparticles) or metal salts (e.g., metal nitrate (such as nickel nitrate, iron nitrate, or cobalt nitrate), metal sulfate, or metal chlorate) can be used as the catalyst material for synthesis of metal filled CNTs. A spin coating technique can be used to prepare catalyst precursors on a substrate, and/or a dip coating technique can be used to load metal nanoparticles on a metal foam substrate. Ultrasonication can be used to collect filled CNTs after synthesis, and a magnet can be used to purify the filled CNTs during/after collection. Any suitable substrate (e.g., silicon or a metal foam such as nickel foam) can be used in the synthesis. Substrates can be reused/recycled to synthesize filled CNTs again after collection of a previous batch of synthesized filled CNTs. A metal foam substrate, if used, can be pretreated to increase efficiency of synthesis. The concentration of catalyst precursor can be varied/chosen to control the length and/or diameter of synthesized filled CNTs. Also, different concentrations of metal nanoparticle-solvent suspension can be used to control the amount of metal sulfide nanowire filled CNTs synthesized in a metal foam substrate.

Embodiments of the subject invention provide compounds that comprise a CNT (e.g., a multi-walled CNT) and a nanowire of a metal sulfide filled in the CNT. The CNT can have a filling ratio of the metal sulfide of at least 0.90 (or even 0.99), and the CNT can have a length of at least 5 µm. The CNT filled with the nanowire can be straight from one end (i.e., a first end thereof) to the other end (i.e., a second end thereof). Each of the first end and the second end of the CNT filled with the nanowire can be closed with carbon shells. The metal sulfide can be, for example, nickel sulfide, cobalt sulfide, or iron sulfide (e.g., the metal sulfide can be $Ni_3S_2$, $Co_9S_8$, or $Fe_xS_y$).

The structure of the filler has been confirmed by X-ray diffraction (XRD) measurements, and the quality of the filled CNTs was assessed by Raman spectroscopy; a significantly low value of the ratio between the intensities of D and G bands (e.g., $I_D/I_G$=0.26) show that the CNT shells of the filled CNTs (e.g., $Ni_3S_2$ filled CNTs) are exceptionally well-graphitized and of ultra-high quality. Electron microscopy measurements have also confirmed that CNTs can be completely and continuously filled with single crystalline nanowires of $Ni_3S_2$ (heazlewoodite) (e.g., rhombohedral $Ni_3S_2$) up to several micrometers (or several tens of micrometers) in length. $Ni_3S_2$ filled CNTs exhibit unique absorption properties in the UV-Vis region due to the transfer of electrons from carbon shells to the $Ni_3S_2$ nanowire. Any suitable substrate can be used, including but not limited to conductive three-dimensional nickel foam (3D Ni—F) or silicon. $Ni_3S_2$ filled CNTs synthesized on conductive 3D Ni—F substrates ($Ni_3S_2$@CNTs/Ni—F) have many potential applications, including but not limited to anode materials for high capacity lithium-ion batteries and electrocatalysts for water splitting reactions.

Filled carbon nanotubes (CNTs) exhibit unique physical properties arising from the synergistic effects of the carbon shells and the filling material, making them attractive for numerous applications. Although inorganic and organic materials have been successfully encapsulated inside CNTs, there is still a lack of a reliable, efficient, scalable, and economical method in the related art to achieve a complete (or even near complete) filling of CNT cores with transition metal sulfide nanowires.

In general, there are two different approaches of filling CNTs that are known as ex situ filling and in situ filling. Ex situ filling is a multi-step filling of the cores of carbon nanotubes by foreign elements, which can also be referred to as post-synthesis filling. There are three major steps involved in this filling process: (1) synthesis of carbon nanotubes; (2) opening the closed caps of carbon nanotubes; and (3) filling of the open carbon nanotubes. Opening of carbon nanotubes is usually realized by oxidation using oxygen ($O_2$) and acid. Once the ends of carbon nanotubes are opened, they can be filled by foreign materials in several ways. Most common filling techniques are a physical method (e.g., capillary induced filling) and wet chemical method. The physical method uses an annealing at a temperature that is higher than the melting point of a filling precursor. The precursor deposited in the surface of carbon nanotubes can melt and eventually impregnate inside carbon nanotubes whose tips remain open during annealing. The wet chemical technique uses an acidic treatment to open the tips of carbon nanotubes and a solution of precursor that can fill carbon nanotubes during oxidation and transform chemically after further heating/reduction. The latter approach is widely used because it favors the filling with a heterogeneity of elements and the formation of single crystalline metallic nanostructures inside carbon nanotubes.

The ex situ approach is limited by following factors. (1) The opening of carbon nanotubes is a destructive process, and it damages the walls of the carbon nanotubes while it opens the carbon nanotube tips. (2) The opening efficiency is highly dependent on the degree of dispersion of the carbon nanotubes. (3) The fillers are often segments or particles resulting in non-complete (or non-uniform) filling of the carbon nanotubes. (4) The fillers inside the open carbon nanotubes are not protected at the ends.

In situ filling of carbon nanotubes refers to a single-step filling process. Unlike ex situ filling, which requires the opening of nanotube ends, this one-step synthesis is able to generate carbon nanotubes with ends closed at both sides, keeping the capsule intact and the core material preserved from undesired chemical reactions (e.g., oxidation) with the surrounding environment. Also, this process is applicable to elements that have high surface tension and do not apply with capillarity or wetting techniques. Being a single step method, this process is a quicker way of filling carbon nanotubes, ensuring less exertion and an ease of control during the filling process over several parameters that are responsible for the results. Commonly used methods for in situ filling of carbon nanotubes include the arc discharge method and chemical vapor deposition (CVD). These methods can successfully fill carbon nanotubes with several metals, alloys, and metallic compounds. Though, the arc discharge method suffers serious limitations such as difficulty in filling carbon nanotubes by pure metals (as they usually react with carbon to form metal carbides), lower efficiency, infeasibility to fill carbon nanotubes by multi-component fillers such as metal alloys, and poor control over the filling process likely due to high temperature gradients that are characteristic of a plasma reactor.

CVD is a synthesis process that involves a catalytic activity of metal or metallic compounds involved in the system. It facilitates simultaneous growth of carbon nanotubes and metal, which catalyzes the growth so as to encapsulate the excess of catalyst inside carbon nanotubes usually in form of nanowires. Unlike arc discharge, CVD works at relatively lower temperatures typically using metal catalyst deposited in the form of a thin film or powder on substrates. Metal sulfide (e.g., nickel sulfide, iron sulfide, and cobalt sulfide) filled carbon nanotubes have not been successfully synthesized using the in situ method in the related art. Although an alloy of iron sulfide and nickel sulfide has been filled inside carbon nanotubes (see Su et al., In Situ Synthesis of Iron/Nickel Sulfide Nanostructures-Filled Carbon Nanotubes and Their Electromagnetic and Microwave-Absorbing Properties, The Journal of Physical Chemistry C 2011, 115 (5), 1838-1842, which is hereby incorporated by reference herein in its entirety), the filler was not a pure single phase iron sulfide or nickel sulfide but an alloy of them because stainless steel was used as the metal precursor that contains mainly iron and nickel elements, the filling rate was very low meaning only a small fraction of the carbon nanotubes were filled, and all the filled carbon nanotubes were curved. Among the filled carbon nanotubes, many of them were partially filled. Cobalt sulfide ($Co_9S_8$) has also been filled inside carbon nanotubes (see Du et al., Filling Carbon Nanotubes with Co9S8 Nanowires through in Situ Catalyst Transition and Extrusion, J. Phys. Chem. C, 112 (2008) 1890-1895, which is hereby incorporated by reference herein in its entirety), a mixture of cobalt salt ($Co(NO_3)_2 \cdot 6H2O$) and magnesium salt ($Mg(NO_3)_2 \cdot 6H2O$) was used as a catalyst precursor, and magnesium oxide (MgO) resulted from the magnesium salt decomposition was present as an impurity in the synthesized materials and was difficult to remove, and the filling rate of the carbon nanotubes was low. Embodiments of the subject invention are able to synthesize metals sulfide (including nickel sulfide, iron sulfide, and cobalt sulfide) filled carbon nanotubes with a very high filling rate and high purity. The core of the carbon nanotube is completely (or nearly completely) filled with the metal sulfide nanowires, and metal sulfide nanowires filled carbon nanotubes are always (or at least predominantly) straight (and not curved).

As discussed above, ex situ filling is a multi-step filling process that is also referred to as post synthesis filling because it requires the synthesis of CNTs as the first step, opening of CNT tips as the second step, and filling of CNTs as the final step. On the other hand, in situ filling is a single step filling process in which CNTs are synthesized and filled simultaneously such that the final result is a filled CNT having its ends closed by carbon shells keeping the CNT intact and thus preserving the filler from any chemical reaction with the surrounding environment. In situ filling is a more advanced technique that allows the complete (or near complete) filling of CNT cores with a continuous nanowire of the filler whereas the ex situ method typically results in a partial filling, the filler remaining as nanoparticles, nanocrystals, or nanorods. Another big advantage of in situ filling is the quality of the products as this method does not require any form of acid treatment or annealing to open the CNT tips, which would cause severe damage to the CNT walls inducing structural defects. Moreover, it is also applicable towards filling CNTs with various elements that bear a high surface tension (e.g., greater than 200 milliNewtons per meter ($mNm^{-1}$)) and cannot be sucked into the CNT core by capillary action due to the violation of wetting conditions. Also, being a quick one-step process, it is easy to control the growth and filling parameters in the in situ method, which makes it more reliable and efficient.

CNTs have been filled with a wide variety of both inorganic and organic materials, but related art filled CNTs are typically achieved using the ex situ method. An efficient in situ filling of CNTs with long and continuous nanowires of a material has remained a challenge in the related art. There exists a need in the art for in situ filling of CNTs with heterogeneity of materials, and the commercialization of such has remained elusive due to the dearth of the amount that can be synthesized using the existing techniques. In other words, a small quantity of X@CNTs (where "X" is the filling material) typically synthesized on a two-dimensional substrate such as silicon or stainless steel can only serve as a primary model to understand some basic properties of the nanohybrid but it is unfeasible to explore their properties in more detail. Also, many application tests demand a large quantity of X@CNTs along with a high quality, which entails an up-scaled and reliable synthesis technique.

An attractive material is the nanostructured nickel (Ni) sulfides due to their extraordinary physical properties. However, their encapsulation inside CNTs has not been achieved previously. The in situ synthesis of nickel sulfide filled CNTs is viable because transition metals such as Ni have a few d-vacancies and act as some of the best catalysts to nucleate and grow CNTs. The presence of sulfur (S) during the material synthesis also induces the graphitization of carbonaceous materials. Besides, a sulfidation reaction can proceed when a proper amount of S atoms is released on the nickel catalyst nanoparticles (NPs) forming a nickel sulfide nucleus, which not only promotes the CNT growth but also gets extruded into the CNT in form of a long nanowire.

Nickel sulfide can exist in various stable phases with simplest to more complex stoichiometric forms such as $\alpha$-NiS, $\beta$-NiS, $NiS_2$, $Ni_3S_2$, $Ni_3S_4$, $Ni_7S_6$, $Ni_9S_8$, $Ni_{17}S_{18}$, etc. Among these various members of the nickel sulfide family, $Ni_3S_2$ (heazlewoodite) is attractive due to its intrinsic metallic behavior, rich abundance, high stability, high energy capacity, environmentally friendly behavior, and remarkable electrocatalytic properties. The physical properties of $Ni_3S_2$ can be further elevated by incorporating it with carbon materials. For example, $Ni_3S_2$ nanocrystals wrapped with a few layers of carbon and anchored on graphene sheets ($Ni_3S_2$@C/RGO) can exhibit discharge capacities up to 850 and 630 $mAhg^{-1}$ at current densities of 200 and 5000 $mAg^{-1}$, respectively, when evaluated as lithium ion battery (LIB) anodes (see Guan et al., Carbon Wrapped $Ni_3S_2$ Nanocrystals Anchored on Graphene Sheets as Anode Materials for Lithium-Ion Battery and the Study on Their Capacity Evolution, Nanomaterials (Basel), 8 (2018) 760, which is hereby incorporated by reference herein in its entirety). The enhancement in the electrochemical performance of $Ni_3S_2$ is attributed to the wrapping effect by carbon (C) layers, which can prevent the structure pulverization of $Ni_3S_2$ nanocrystals during $Li^+$ insertion/desertion. Similarly, carbon coated $Ni_3S_2$ nanowires behave as an efficient electrocatalyst for hydrogen evolution reactions exhibiting a potential of about 199 mV at 10 $mAcm^{-2}$ along with a prolonged stability over 30 hours at a current density of 20 $mAcm^{-2}$ (see Li et al., One-step synthesis of $Ni_3S_2$ nanowires at low temperature as efficient electrocatalyst for hydrogen evolution reaction, International Journal of Hydrogen Energy, 42 (2017) 7136-7142, which is hereby incorporated by reference herein in its entirety). Likewise, graphene decorated $Ni_3S_2$ ($Ni_3S_2$@G) pyramids synthesized on three-dimensional nickel foam (3D Ni—F) show improved electrocatalytic activity for both hydrogen evolution reactions and oxygen evolution reactions during water splitting experiments (see Yu et al., In-situ growth of graphene decorated $Ni_3S_2$ pyramids on Ni foam for high-performance overall water splitting, Applied Surface Science, 465 (2019) 772-779, which is hereby incorporated by reference herein in its entirety). The enhancement is due to the synergistic effects of $Ni_3S_2$ and graphene, as well as the binder free nature of the $Ni_3S_2$@G electrode firmly attached on three-dimensional (3D) nickel foam (Ni—F) substrates having a large surface area and a high porosity. $Ni_3S_2$@CNTs exhibit unique physical properties and can find numerous applications in the fabrication of next generation electronic or electrochemical devices.

Embodiments of the subject invention include CNTs (e.g., multi-walled CNTs or single-walled CNTs) filled with metal sulfide. The filled CNTs can have an average filling ratio (the proportion of the CNT that is filled to the total CNT) of 0.80 or higher and an average length of 5 µm or higher. The average filling ratio can be any of the following values, about any of the following values, at least any of the following values, or greater than any of the following values (all values are unitless): 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99, 0.995, or 1.0. The average length of the CNTs can be any of the following values, about any of the following values, at least any of the following values, or greater than any of the following values (all values are in µm): 4, 5, 6, 7, 8, 9, 10, 10.5, 11, 12, 13, 14, 15, 16, 17, 18, 19, 20, 20.16, 21, 22, 23, 24, 25, 30, 34.93, 35, 40, 45, 50, 55, 60, 65, 70, 75, 80, 85, 90, 95, or 100. As seen in FIGS. 3a-3f, 6c-6f, 7a, 7b, 8c, 8d, 9a-9d, 13a-13d, and 14a-14d, the filling ratio of the CNTs prepared in the examples is very high (>0.98, and about 1.0 in some cases) and the lengths are long. These extremely high filling ratios have not been obtained previously in metal sulfide filled CNTs, and it is due to the efficient in situ method using CVD as disclosed herein. The embodiments of the subject invention have also overcome the problem in the related art where oxides (e.g., MgO) could be difficult to eliminate from filled CNTs such that the filled CNTs with oxide present had low purity.

Embodiments of the subject include in situ methods to synthesize multi-walled or single-walled CNTs filled with metal sulfide (e.g., nickel sulfide) nanowires. Different precursors and/or substrates can be used. For example, $Ni_3S_2$@CNTs can be grown on silicon (Si) substrates with a control over their lengths and diameters, and/or a significant mass of $Ni_3S_2$@CNTs can be synthesized on conductive 3D Ni—F substrates. Both of these techniques lead to the growth of high-quality CNTs completely and continuously filled with $Ni_3S_2$ nanowires several micrometers (e.g., at least 5 µm) in length. These synthesis methods can also be implemented to fill CNTs with other transition metal sulfides including but not necessarily limited to iron sulfide and cobalt sulfide.

In many embodiments, metal (e.g., nickel, iron, cobalt) nanoparticles or a salt thereof (e.g., metal nitrate (such as nickel nitrate, iron nitrate, or cobalt nitrate), metal sulfate, or metal chlorate) and a sulfur-containing compound (e.g., thiophene or dimethyl sulfide) can be used as the precursors for the synthesis of metal sulfide filled CNTs at low cost. The CNT growth and filling of metal sulfide occurs simultaneously (in situ filling as opposed to ex situ filling that involves opening CNTs first and then filling them). Unlike related art CNTs that are sporadically filled with filler particles or segments, the CNTs in embodiments of the subject invention are uniformly filled with long continuous metal sulfide nanowires. The technology disclosed herein enables larges-cale production of metal sulfide filled CNTs.

Embodiments of the subject invention provide synthesis methods of metal sulfide filled CNTs using metal nanoparticles or their salts and a sulfur-containing compound (e.g., a sulfur-containing hydrocarbon such as thiophene or dimethyl sulfide) as precursors to in situ synthesize the metal sulfide nanowire filled CNTs via a CVD method. This in situ growth process includes the CNTs and metal sulfide nanowires inside the CNTs being grown simultaneously in a one-step and easily controlled process. The metal sulfide nanowires are continuous crystalline nanowires encapsulated inside closed carbon nanotubes. This is the most reliable and efficient way of producing closed carbon nanotube hybrids in situ. It is an extremely useful technique to fill carbon nanotubes with long continuous nanowires of metal (e.g., Fe, Co, Ni) sulfides with ease and at low cost. The filled CNTs have applications in, for example, material science, electronic devices, energy, and environmental protection.

Specific applications include but are not limited to lithium ion batteries, microwave absorbers, sensing probes for magnetic force microscopy, filtration of toxic elements from fluids, magnetic recording and data storage devices, biological/chemical sensors, drug delivery/carrier systems, and nanothermometers. As an example, metal sulfides are promising anode materials for energy storage for lithium ion batteries as they have much higher lithium ion storage capacity than the currently commercially used graphite electrodes. However, metal sulfides tend to break due to their large volume change during the charge-discharge cycles, so the breakdown of the metal sulfides can cause the lithium ion battery to fail. The encapsulation of the metal sulfides by the CNTs inhibits or prevents the metal sulfide breakdown because the strong CNT protects the metal sulfide from collapse. In addition, the excellent electrical conductivity of the CNTs improves the electron conduction during the charge-discharge cycles. As a result, lithium ion batteries using metal sulfide filled CNTs as anode materials have significantly improved performance.

Filled CNTs of embodiments of the subject invention have many applications. The solid core-shell structure with highly ordered carbon shells, better electronic conductivity, and mechanical strength (and in some cases direct growth of filled CNTs on conductive Ni—F) make such filled CNTs excellent candidates for various applications such as in energy storage devices (lithium ion batteries (LIBs) and supercapacitors), electrocatalysis of water, and nanoelectromechanical systems (NEMS). For example, one major application of $Ni_3S_2$@CNTs is to use them in energy storage devices such as LIBs and supercapacitors. Given the high theoretical lithium storage capacity (445 mAhg$^{-1}$) of $Ni_3S_2$, mechanical strength offered by CNT walls, better electronic conductivity of both CNTs and $Ni_3S_2$, and a high specific surface area of the 3D Ni—F substrate, $Ni_3S_2$@CNTs (e.g., $Ni_3S_2$@CNTs grown on nickel foam substrates ($Ni_3S_2$@CNTs/Ni—F)) electrodes can dramatically improve the electrochemical performance of LIBs and supercapacitors. The incorporation of nanostructured $Ni_3S_2$ with several carbonaceous materials is promising as LIB anodes. $Ni_3S_2$@CNTs provide excellent results due to the complete encapsulation of the filler by carbon shells, which can easily inhibit or prevent the structural degradation of $Ni_3S_2$ during lithiation and de-lithiation cycles. Moreover, the continuity of $Ni_3S_2$ nanowire between the CNT tips and roots provides more active sites for electrochemical reactions and also facilitates a fast transfer of electrons and ions. Another important application of $Ni_3S_2$@CNTs can be envisioned in water splitting reactions. Several nanostructures of $Ni_3S_2$ and their composites have garnered intense concerns in hydrogen evolution reaction (HER), oxygen evolution reaction (OER), and oxygen reduction reaction (ORR) due to their outstanding electrocatalytic activities. However, pristine $Ni_3S_2$ catalysts lose their efficiency and stability over time due to their structure pulverization caused during oxidation/reduction cycles. The encapsulation of $Ni_3S_2$ by robust CNT walls can overcome this problem, and $Ni_3S_2$@CNTs can act as efficient electrocatalysts for HER, OER, and ORR. Meanwhile, the binder free nature of $Ni_3S_2$@CNTs/Ni—F electrode ensures high activity and stability. Also, Ni—F itself increases the catalytic activity due to its high specific surface area and also enhances the ionic/electronic conductivity due to its open pore structure. In addition to these major applications, $Ni_3S_2$@CNTs may find other interesting applications in nanoelectrochemical systems (NEMS) because of the mechanical reinforcement possessed by the solid core-shell structure and good electronic conductivity of both the CNTs and $Ni_3S_2$.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to the invention.

Materials and Methods

Nickel nitrate hexahydrate ($Ni(NO_3)_2 \cdot 6H_2O$, 99% pure) was obtained from Fisher Scientific International, Inc. Ni nanoparticles (NPs) (99.9%, 40 nm, metal basis) were obtained from US Research Nanomaterials, Inc., and Ni foam (99.99%, 1.6 mm thick, 80-100 pores per inch) was obtained from MTI Corporation. All reagents—isopropyl alcohol (IPA), acetone, and ethanol—were obtained from Fisher Scientific and were used as received. Thiophene ($C_4H_4S$) of extra pure grade (99+%) was obtained from Acros Organics and was used as the precursor for both the carbon and sulfur. Empty multi-walled CNTs (used as reference) were synthesized using a method similar to that previously reported (see Xie et al., Large-Scale Synthesis of Aligned Carbon Nanotubes, Science, 274 (1996) 1701 and Pan et al., Very long carbon nanotubes, Nature, 394 (1998) 631-632; both of which are hereby incorporate by reference herein in their entireties). Briefly, CNTs were synthesized on iron/silica substrates by the pyrolysis of acetylene. The iron/silica substrates were formed by a sol-gel process in which tetraethoxysilane and iron nitrate aqueous solution were used as the precursors and concentrated hydrogen fluoride was used as additive to control the gelation speed. After gelation, the gel was dried overnight at about 100° C. to form substrates, and then the substrates were calcined at 450° C. overnight. For the carbon nanotube synthesis, the substrates were reduced at 550° C. for 5 hours in a flow of 9% $H_2/N_2$ with a flow rate of 110 cm$^3$/min to yield iron nanoparticles on the surface of silica. Subsequently, carbon nanotubes were produced on the substrates in a flow of 9% acetylene in nitrogen with 110 cm$^3$/min flow rate at 650° C. for 24 hours. The setup shown in FIG. 1 was used for synthesis of filled CNTs.

Scanning electron microscope (SEM) images for characterization were acquired by using Field Emission Scanning Electron Microscope (FESEM) JEOL JSM-6330F with an accelerating voltage of 25 kilovolts (kV). Transmission electron microscopy (TEM) images, energy dispersive X-ray (EDX) spectra, and selected area electron diffraction (SAED) patterns for characterization were collected by using a Tecnai G$^2$ 20 U-Twin high-resolution transmission electron microscope with an acceleration voltage of 200 kV. X-ray spectroscopy for characterization was performed on powder samples using Siemens Diffraktometer D5000 with Cu Kα radiation (λ=1.54 Å). Raman spectroscopy for characterization was performed using a Raman microscope setup described with a laser wavelength of 632.8 nm (see Guo et al., Monitoring the Dynamic Process of Formation of Plasmonic Molecular Junctions during Single Nanoparticle Collisions, Small, 14 (2018) 1704164; which is hereby incorporated herein by reference in its entirety). UV-Vis spectra for characterization were collected in an Agilent Technologies Cary Series UV-Vis-NIR spectrophotometer.

Example 1—Synthesis of $Ni_3S_2$@CNTs Using Nickel Salt

Three different catalyst solutions with concentrations of 0.02 molar (M), 0.04 M and 0.06 M, respectively, were prepared by mixing crushed powder of $Ni(NO_3)_2 \cdot 6H_2O$ and IPA. 5 microliters (μl) of the catalyst solution was dropped on the surface of a silicon (Si) substrate cleaned by ultrasonication using de-ionized (DI) water, acetone, and IPA successively. A thin film of catalyst layer was then formed on the surface of the Si substrate using a two-stage spin coating. The spin rates were optimized as 850 rpm for 60 seconds in the first stage and 2000 rpm for another 60 seconds in the second stage to form a uniform coating of catalyst particles on the surface of the substrate.

Three to four substrates coated with a catalyst layer were placed in a quartz boat and aligned to the center of a quartz tube, which was then heated in a furnace at 600° C. for 30 minutes to oxidize the catalyst layer. Then, argon (Ar) was passed through the tube via valve A (see FIG. 1) at a flow rate of 100-200 standard cubic centimeters per minute (sccm) and $H_2$ at 100-200 sccm for 15 minutes, which were responsible for creating an inert atmosphere and reducing the catalyst particles, respectively. Valve C was closed during the reduction step such that $H_2$ gas could pass through valve B. After reduction, the flow of $H_2$ was stopped whereas Ar continued to flow until the temperature of the furnace reached 1000° C.-1200° C. The flow rate of Ar was then increased to 1650-1850 sccm and $H_2$ was resumed to flow at 100-200 sccm but along a new flow path via valve C. Such flow could bubble the $H_2$ through thiophene ($C_4H_4S$), which was used as a precursor for both carbon and sulfur. During a synthesis time of 10-30 mins, CNTs could grow and fill themselves with $Ni_3S_2$ nanowires simultaneously. After the reaction time was completed, the flow of $H_2$ was cut off and the reaction chamber was cooled down under an inert atmosphere keeping Ar to flow continuously at 100-200 sccm.

Figures 2A, 2B, 2C, 2D, 2E, 2F, 2G, 2H, 2I:
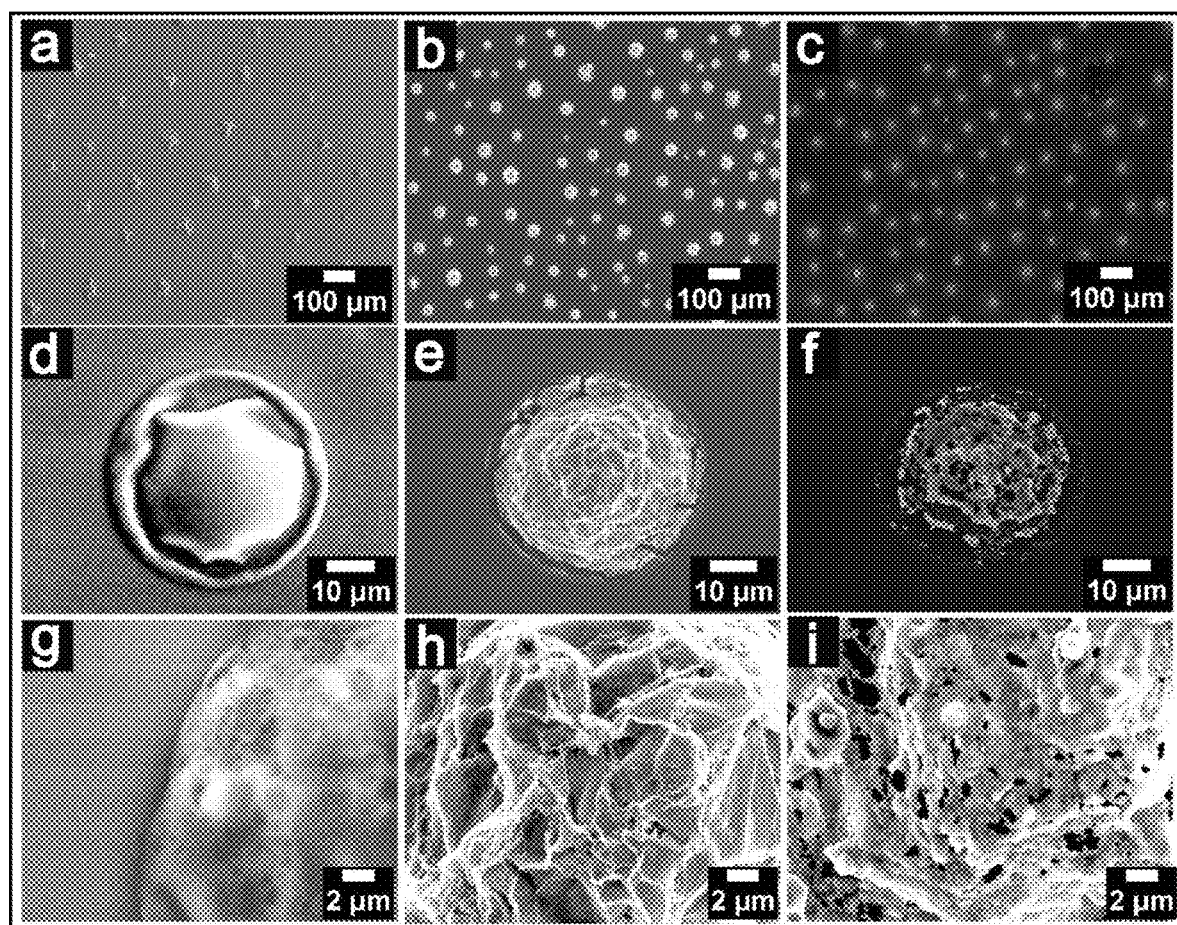
FIG. 2a is a scanning electron microscope (SEM) image of 0.06 molar (M) catalyst particles after dispersion. The scale bar is 100 µm.
FIG. 2b is an SEM image of the 0.06 M catalyst particles of FIG. 2a, after oxidation. The scale bar is 100 µm.
FIG. 2c is an SEM image of the 0.06 M catalyst particles of FIG. 2a, after reduction. The scale bar is 100 µm.
FIG. 2d is an SEM image of a single catalyst particle after dispersion. The scale bar is 10 µm.
FIG. 2e is an SEM image of a single catalyst particle after oxidation. The scale bar is 10 µm.
FIG. 2f is an SEM image of a single catalyst particle after reduction. The scale bar is 10 µm.
FIG. 2g is a high magnification SEM image of a single catalyst particle after dispersion. The scale bar is 2 µm.
FIG. 2h is a high magnification SEM image of a single catalyst particle after oxidation. The scale bar is 2 µm.
FIG. 2i is a high magnification SEM image of a single catalyst particle after reduction. The scale bar is 2 µm.
Figures 3A, 3B, 3C, 3D, 3E, 3F:
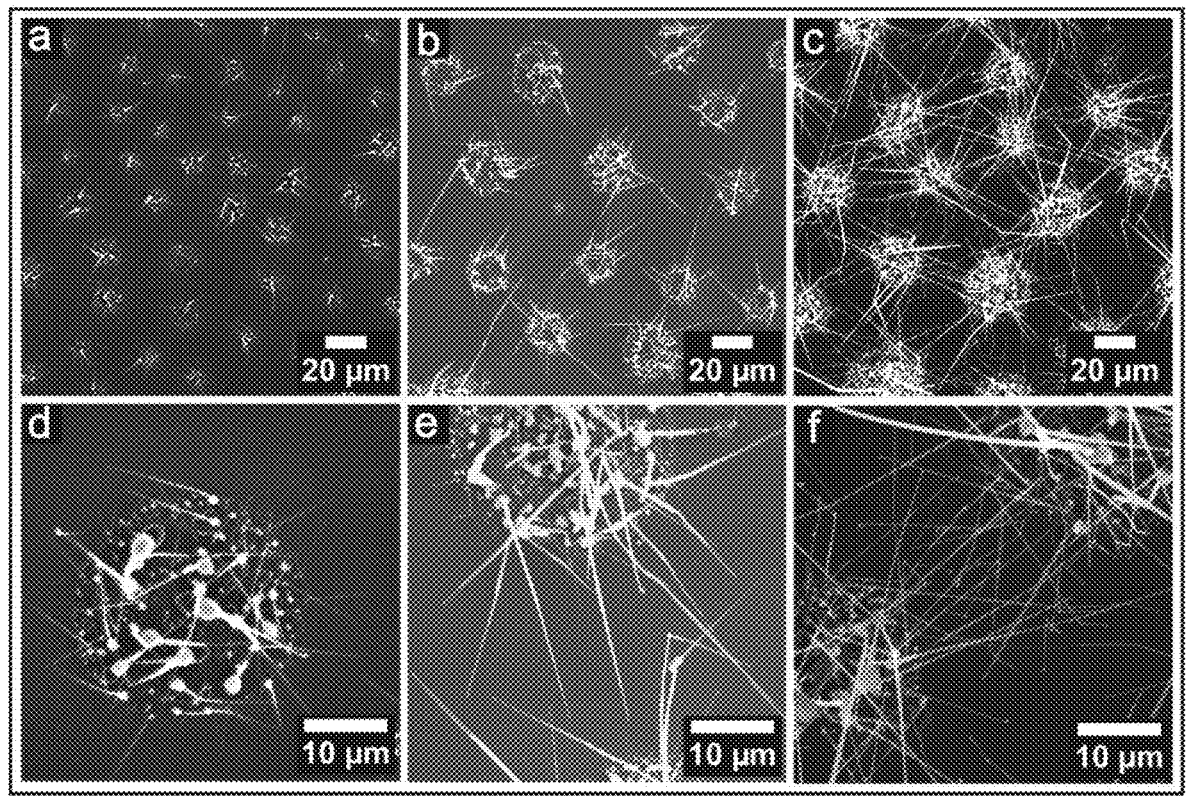
FIG. 3a is an SEM image of $Ni_3S_2$ filled CNTs synthesized using $Ni(NO_3)_2 \cdot 6H_2O$ IPA suspensions of a concentration of 0.02 M. The scale bar is 20 µm.
FIG. 3b is an SEM image of $Ni_3S_2$ filled CNTs synthesized using $Ni(NO_3)_2 \cdot 6H_2O$ IPA suspensions of a concentration of 0.04 M. The scale bar is 20 µm.
FIG. 3c is an SEM image of $Ni_3S_2$ filled CNTs synthesized using $Ni(NO_3)_2 \cdot 6H_2O$ IPA suspensions of a concentration of 0.06 M. The scale bar is 20 µm.
FIG. 3d is a high magnification SEM image of $Ni_3S_2$ filled CNTs synthesized using $Ni(NO_3)_2 \cdot 6H_2O$ IPA suspensions of a concentration of 0.02 M. The scale bar is 10 µm.
FIG. 3e is a high magnification SEM image of $Ni_3S_2$ filled CNTs synthesized using $Ni(NO_3)_2 \cdot 6H_2O$ IPA suspensions of a concentration of 0.04 M. The scale bar is 10 µm.
FIG. 3f is a high magnification SEM image of $Ni_3S_2$ filled CNTs synthesized using $Ni(NO_3)_2 \cdot 6H_2O$ IPA suspensions of a concentration of 0.06 M. The scale bar is 10 µm.
Figures 4A, 4B, 4C, 4D, 4E, 4F:
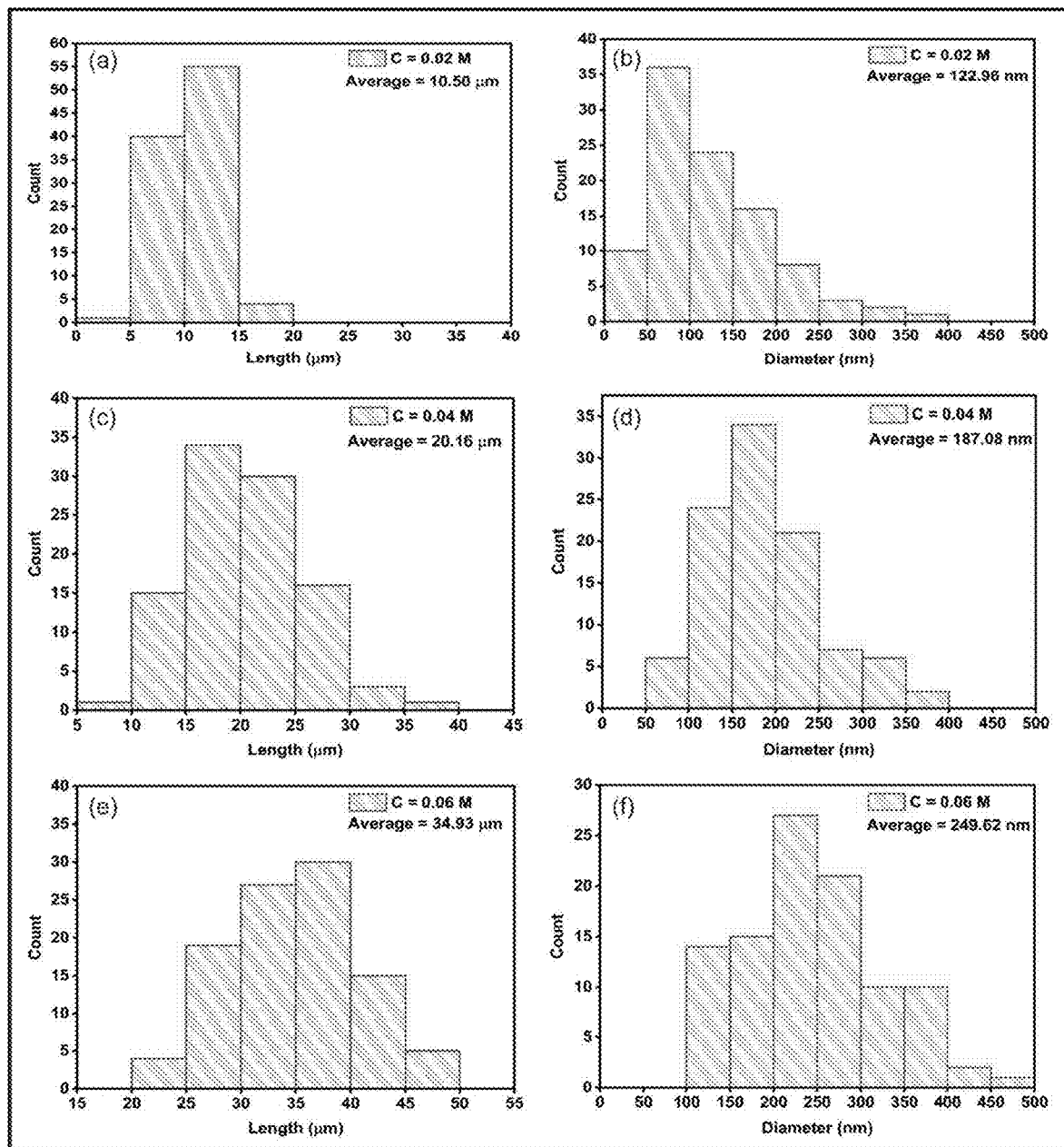
FIG. 4a is a chart of the distribution of length (in µm) of $Ni_3S_2$ filled CNTs synthesized using catalyst at a concentration of 0.02 M.
FIG. 4b is a chart of the distribution of diameter (in nm) of $Ni_3S_2$ filled CNTs synthesized using catalyst at a concentration of 0.02 M.
FIG. 4c is a chart of the distribution of length (in µm) of $Ni_3S_2$ filled CNTs synthesized using catalyst at a concentration of 0.04 M.
FIG. 4d is a chart of the distribution of diameter (in nm) of $Ni_3S_2$ filled CNTs synthesized using catalyst at a concentration of 0.04 M.
FIG. 4e is a chart of the distribution of length (in µm) of $Ni_3S_2$ filled CNTs synthesized using catalyst at a concentration of 0.06 M.
FIG. 4f is a chart of the distribution of diameter (in nm) of $Ni_3S_2$ filled CNTs synthesized using catalyst at a concentration of 0.06 M.

The images of a representative single particle after dispersion, oxidation, and reduction are shown in FIGS. 2d-2f, respectively. Referring to 2d, a smooth dome-shaped surface can be seen on the micro hemisphere surrounded by a ring-like structure, which then ruptures into a rose-like surface with multiple layers after oxidation in air at 600° C. as shown in FIG. 2e. FIG. 2f represents the micro hemisphere after reduction by $H_2$ gas showing a further fissure of the surface forming several porous clusters of particles. A more detailed structure of the surface of the hemispherical particle is shown in the high magnification images of FIGS. 2g-2i. The original catalyst particle (shown in FIG. 2g) gets thermally decomposed in several steps and finally converts into nickel oxide (NiO) at a temperature of about 600° C., and the high temperature causes multiple fractures of the particle surface as shown in FIG. 2h. Upon reduction by $H_2$ gas, NiO converts into metallic Ni and the prolonged exposure in high temperature leads to the further modification of the surface as shown in FIG. 2i. The multiple layers observed in FIG. 2h disappeared after reduction, and the surface then included an abundance of NPs of metallic Ni as seen in FIG. 2i. The big clusters can further break down into smaller Ni nanoparticles as the temperature increases during the synthesis process. These Ni NPs are the active sites for nucleation that can form $Ni_3S_2$ through a sulfidation reaction and catalyze the growth of CNTs simultaneously.

The SEM images of three different samples synthesized via nickel salt using the catalysts of three different concentrations 0.02 M, 0.04 M, and 0.06 M are shown in FIGS. 3a-3f. These results correspond to the synthesis conditions in which the flow rate of $H_2$ and Ar were 90 sccm and 1550 sccm, respectively, during a growth time of 15 minutes at 950° C. Both the lower magnification SEM images in FIGS. 3a-3c and the higher magnification SEM images in FIGS. 3d-3f demonstrate successful growth of $Ni_3S_2$@CNTs for each concentration of the catalyst. A relatively higher yield, along with bigger dimensions of $Ni_3S_2$@CNTs, was observed for the catalyst concentration of 0.06 M.

It can be seen in FIGS. 3a-3f that the CNTs produced by this method are straight and tapered with spherical roots and very sharp tips. In contrast, empty CNTs are usually curved and entangled due to radial buckling. Thus, the linear structure of $Ni_3S_2$@CNTs suggests that they are completely filled with $Ni_3S_2$ nanowires between their roots and tips (i.e., filling ratio of the nanowire in the CNT of at least 0.99 (e.g., 1.0)).

The effect of the concentration of catalyst precursor on the dimensions and morphology of $Ni_3S_2$@CNTs was investigated by measuring the lengths and diameters of 100 different $Ni_3S_2$@CNTs from various samples synthesized by using each of the three different concentrations of the catalyst precursor. It was found that the higher concentration of catalyst led to the synthesis of longer and thicker $Ni_3S_2$@CNTs; however, the morphology of $Ni_3S_2$@CNTs remained unchanged. Corresponding to the catalyst concentrations of 0.02 M, 0.04 M and 0.06 M, the lengths of $Ni_3S_2$@CNTs were mainly distributed in the range of 5-15 μm, 15-25 μm, and 30-40 μm, respectively, whereas the diameters measured at their middle section were distributed in the range of 50-150 nm, 100-200 nm, and 200-300 nm, respectively. These results are shown in FIGS. 4a-4f.

Figures 5A, 5B:
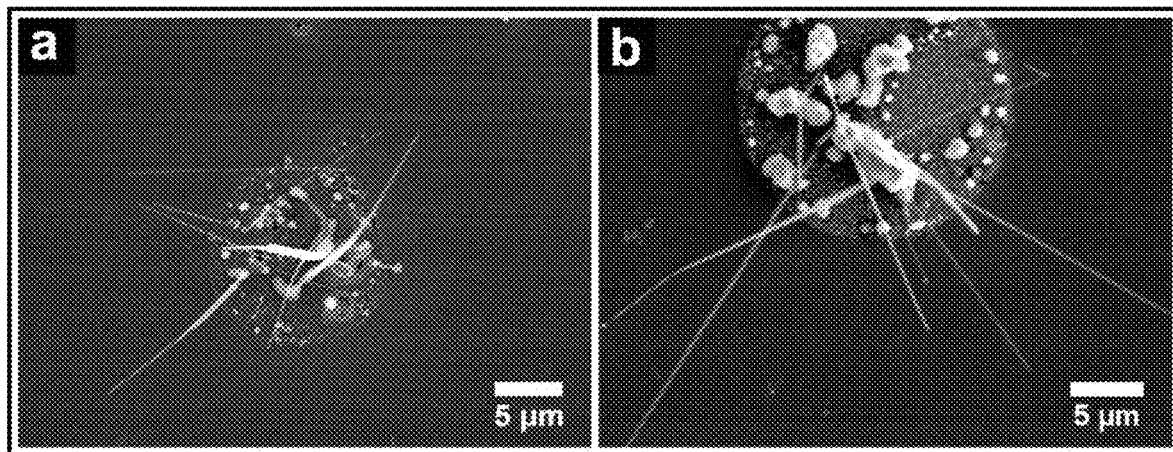
FIG. 5a is an SEM image of $Ni_3S_2$ filled CNTs synthesized using catalyst at a concentration of 0.01 M. The scale bar is 5 µm.
FIG. 5b is an SEM image of $Ni_3S_2$ filled CNTs synthesized using catalyst at a concentration of 0.07 M. The scale bar is 5 µm.

It was found that catalyst precursor concentrations of 0.01 M and 0.07 M led to a lower yield of $Ni_3S_2$@CNTs as shown in FIGS. 5a and 5b, establishing the preferred range for the catalyst concentration for the growth of $Ni_3S_2$@CNTs as 0.2 M-0.06 M.

Example 2—Synthesis of $Ni_3S_2$@CNTs Using Nickel Nanoparticles

The synthesis method using nickel salt (Example 1) is useful to control the lengths and diameters of $Ni_3S_2$@CNTs, but the growth scale is limited. Thus, another method was developed to synthesize a large quantity of $Ni_3S_2$@CNTs on nickel foam (Ni—F) substrates.

Ni nanoparticles (NPs) were dispersed in IPA (20-100 grams per liter (g/l)) and kept in an ultrasonication bath for 5 minutes to achieve a uniform suspension of nanoparticles, and then the suspension was transferred in a vial ready for use. Ni—F was cut into small pieces of roughly 2 cm×2 cm in size, and the pieces were cleaned in DI water, acetone, and IPA successively by ultrasonication. The Ni—F substrates were individually immersed in a vial containing the IPA-Ni NPs suspension and left for dip coating for 5 minutes. During that time, the vial was gently shaken to prevent or inhibit the agglomeration of Ni NPs at the bottom of the vial. Then, the Ni—F was transferred to a hot plate maintained at 150° C. and heated for 5 minutes to evaporate the IPA from the substrate. The CVD growth of $Ni_3S_2$@CNTs was carried out on the Ni—F substrates under the same conditions as described in Example 1, but it is required that Ni—F should undergo a pre-treatment in similar experimental conditions before loading the catalyst particles. The first step (oxidation in air) was eliminated because the catalysts were pure metal NPs. The synthesis methods described in Examples 1 and 2 are summarized in Table 1.

Figures 6A, 6B, 6C, 6D, 6E, 6F:
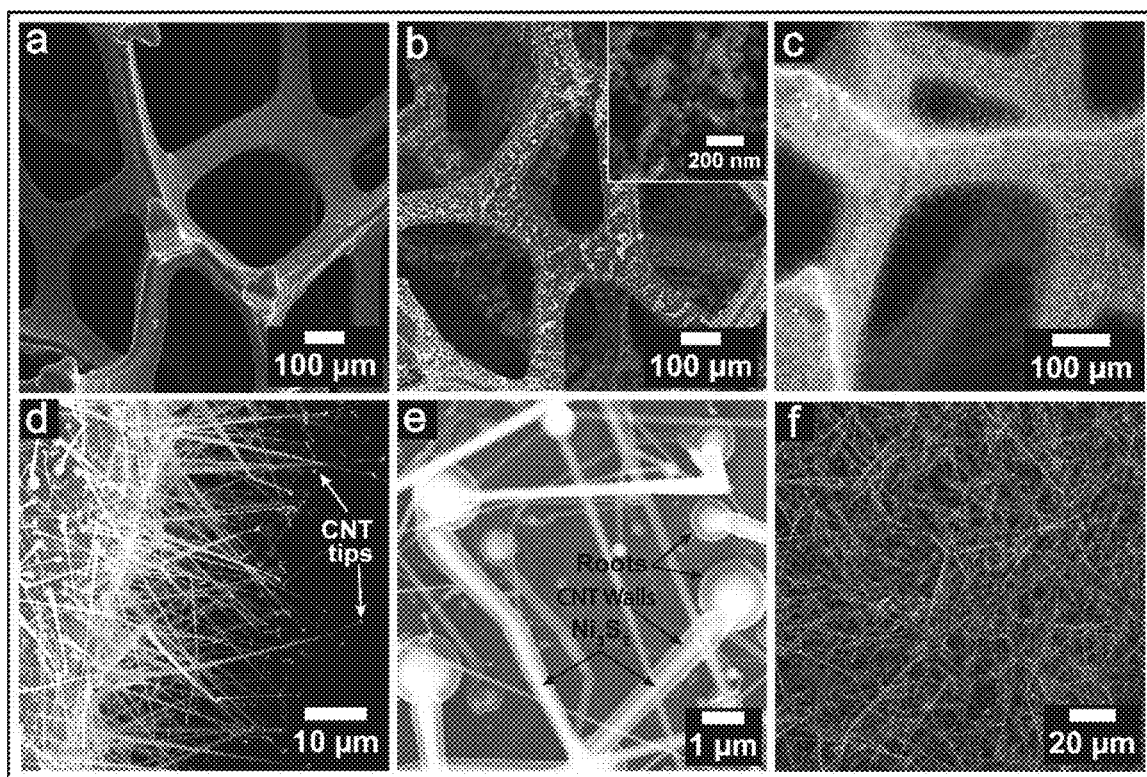
FIG. 6a is an SEM image of pristine nickel foam (Ni—F). The scale bar is 100 µm.
FIG. 6b is an SEM image of catalyst loaded Ni—F. The scale bar is 100 µm. The inset, with a scale bar of 200 nanometers (nm), shows nickel nanoparticles deposited on the surface of the Ni—F.
FIG. 6c is an SEM image of $Ni_3S_2$ filled CNTs grown on the Ni—F. The scale bar is 100 µm.
FIG. 6d is an SEM image showing the straight structure of the $Ni_3S_2$ filled CNTs with closed tips. The scale bar is 10 µm.
FIG. 6e is a high magnification SEM image showing a clear filling of CNTs with $Ni_3S_2$ nanowires and the spherical roots of the $Ni_3S_2$ filled CNTs. The scale bar is 1 µm.
FIG. 6f is an SEM image showing $Ni_3S_2$ filled CNTs collected via ultrasonication and deposited on a piece of silicon wafer. The scale bar is 20 µm.
Figures 7A, 7B:
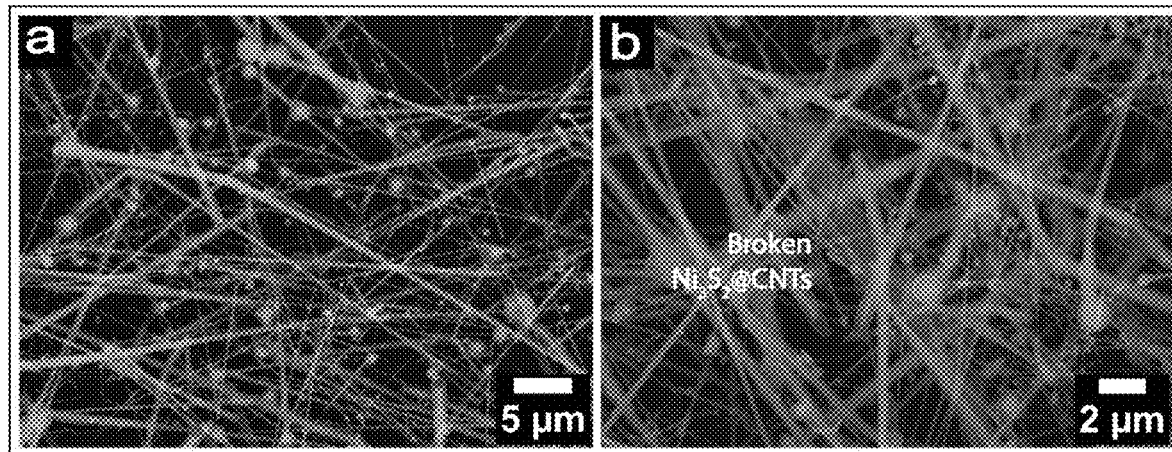
FIG. 7a is an SEM image showing $Ni_3S_2$ filled CNTs after collection via ultrasonication followed by a magnetic purification method. The scale bar is 5 µm.
FIG. 7b is an SEM image showing $Ni_3S_2$ filled CNTs after collection via ultrasonication followed by a magnetic purification method. The scale bar is 2 µm.

The SEM images of $Ni_3S_2$@CNTs synthesized using Ni NPs are depicted in FIGS. 6a-6f. Pristine nickel foam (Ni—F) loaded with nickel catalyst nanoparticles cannot promote the growth of $Ni_3S_2$@CNTs. Thus, a pre-treatment of Ni—F substrates under similar experimental conditions is necessary to activate the growth of $Ni_3S_2$@CNTs from Ni NPs deposited on Ni—F. The main reason behind this situation can be a change in the relative surface energies between Ni—F and Ni NPs as the Ni—F surface undergoes a sulfidation reaction along with carbon diffusion during the pre-treatment process. The pristine Ni—F (FIG. 6a) gets uniformly covered with Ni NPs as shown in FIG. 6b after a pre-treatment process followed by dip-coating with Ni NPs IPA suspension. The 3D structure of Ni—F can accommodate a big mass of Ni NPs, which are the active sites for the growth of $Ni_3S_2$@CNTs. Fortunately, the catalyst loading can be controlled by changing the suspension concentrations. For instance, a particular Ni—F substrate of 2 cm×2 cm, as shown in FIG. 6c, dip coated with a suspension having a concentration of 80 g/l, could accommodate 10.19 mg of Ni NPs after completely drying off.

carbon diffusion that can occur on the Ni—F surface. Thus, the mass of $Ni_3S_2$@CNTs can be estimated as the difference between the final mass of the Ni—F substrate containing $Ni_3S_2$@CNTs and the sum of the initial mass of Ni—F before loading the catalyst particles and its increased mass during nanotube synthesis process. This gives the mass of $Ni_3S_2$@CNTs as 4.10 mg in the aforementioned sample. Because a typical experiment can use 3-4 Ni—F substrates of 2 cm×2 cm size, about 5-20 mg of $Ni_3S_2$@CNTs can be synthesized in a single experiment. However, with an increased size of Ni—F substrate along with an increased mass of catalyst loading, this method can be applicable to synthesize $Ni_3S_2$@CNTs at an industrious scale.

FIG. 6c plainly shows that $Ni_3S_2$@CNTs can grow in several layers of Ni—F, confirming that the multi-layered structure of a substrate such as Ni—F can be advantageous for growing a large quantity of $Ni_3S_2$@CNTs. Also, a high density of $Ni_3S_2$@CNTs observed on the lateral surface (edges) of the Ni—F layers as shown in FIG. 6d suggests that the porous structure of Ni—F also facilitates the growth of $Ni_3S_2$@CNTs and there exists a strong bonding between the CNT roots and Ni—F surface as well. The linear and tapering structure of $Ni_3S_2$@CNTs along with their spherical roots and the catalyst particle enclosing the tips (FIGS. 6d-6e) match exactly with the morphology of $Ni_3S_2$@CNTs synthesized using nickel salt (FIGS. 3d-3f), meaning that $Ni_3S_2$@CNTs follow the same growth mechanism irrespective of the synthesis methods of Example 1 and Example 2. $Ni_3S_2$ nanowires can be clearly distinguished at the core of $Ni_3S_2$@CNTs as shown in FIG. 6e.

$Ni_3S_2$@CNTs grown on Ni—F can be easily collected through a simple and quick process. An individual Ni—F substrate containing $Ni_3S_2$@CNTs was immersed in a clean beaker containing 2.5 ml of IPA. The beaker was placed in an ultrasonication bath for 5 minutes, and the substrate was turned upside down after each minute. The ultrasonication process could easily disengage $Ni_3S_2$@CNTs from the Ni—F substrate, which was reflected as a change in the color of transparent IPA into a turbid dispersion. Also, a simple magnetic purification process was used to collect $Ni_3S_2$@CNTs with a high purity. After the collection of $Ni_3S_2$@CNTs, a small piece of a clean stirring magnet was immersed in the beaker and stirred for 5 min. The magnet can easily attract metallic impurities such as the tiny fragments of Ni—F falling off from the edges of Ni—F during

TABLE 1

CVD growth parameters for Examples 1 and 2.

| Synthesis Method | Precursor/Substrate | Experimental Conditions | | |
|---|---|---|---|---|
| | | Oxidation | Reduction | Synthesis |
| Via Ni salt (Example 1) | Ni $(NO_3)_2 \cdot 6H_2O$/Si | 600° C. 30 mins | Ar: 80-200 sccm $H_2$: 80-200 sccm 10-20 minutes T = 500-650° C. | Ar: 1500-1900 sccm $H_2$: 80-200 sccm 10-30 minutes T = 850-1200° C. |
| Via Ni NPs (Example 2) | Ni NPs/3D Ni—F* | N/A | Ar: 80-200 sccm $H_2$: 80-200 sccm 10-20 minutes T = 500-650° C. | Ar: 1500-1900 sccm $H_2$: 80-200 sccm 10-30 minutes T = 850-1200° C. |

*Substrate pre-treatment required under identical experimental conditions before catalyst loading Referring to FIGS. 6c-6e, almost all Ni catalyst particles participated in the growth of $Ni_3S_2$@CNTs. Also, the Ni—F itself (without loading of catalyst particles) undergoes an increase in mass by 6.3% after pre-treatment under identical synthesis conditions as a result of sulfidation reaction and ultrasonication. The process was repeated for several times until all of the metallic Ni particles were removed from the dispersion containing $Ni_3S_2$@CNTs. FIG. 6f shows the SEM image of a thin film of purified $Ni_3S_2$@CNTs spin-coated on a piece of clean Si wafer. To collect a significant mass (e.g., >50 mg) of pure powder samples (Ni$_3$S$_2$@CNTs clusters), the purified dispersion was transferred to another clean beaker and heated in a hot plate maintained at 150° C., and the whole process was repeated using about 8-10 Ni—F substrates. The pure form of Ni$_3$S$_2$@CNTs thus collected can be plainly seen in FIGS. 7a and 7b. In addition, it also shows that the ultrasonication process can effectively break the nanotubes and open them along their cross-section if needed.

Figures 8A, 8B, 8C, 8D:
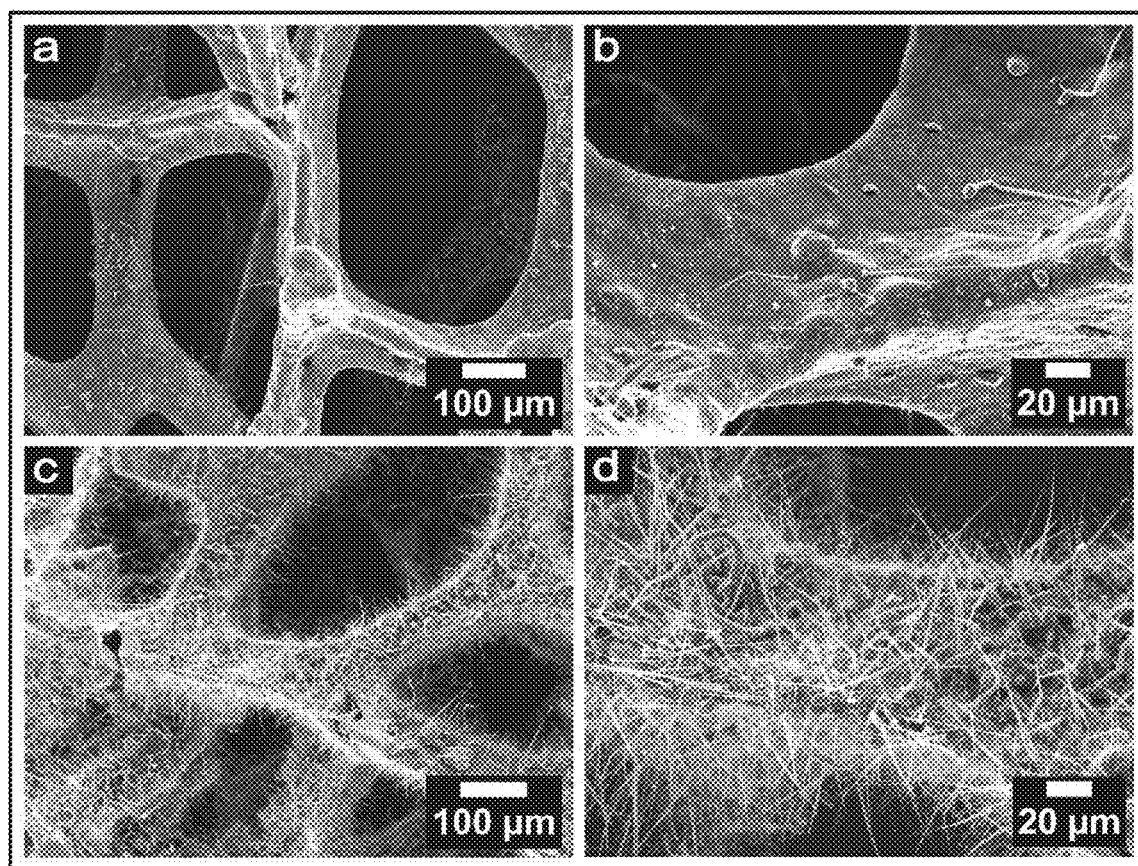
FIG. 8a is an SEM image of Ni—F after collection of $Ni_3S_2$ filled CNTs collected via an ultrasonication process. The scale bar is 100 µm.
FIG. 8b is a higher magnification SEM image of the Ni—F after collection of $Ni_3S_2$ filled CNTs collected via an ultrasonication process. The scale bar is 20 µm.
FIG. 8c is an SEM image of the Ni—F substrate of FIGS. 8a and 8b after regrowth of $Ni_3S_2$ filled CNTs on that same substrate. The scale bar is 100 µm.
FIG. 8d is a higher magnification SEM image of the Ni—F substrate of FIGS. 8a and 8b after regrowth of $Ni_3S_2$ filled CNTs on that same substrate. The scale bar is 20 µm.

Besides the simplicity of the one-step synthesis method, it is also cost-effective as the same Ni—F substrate can undergo a recycle process to grow a new batch of Ni$_3$S$_2$@CNTs. FIGS. 8a and 8b show SEM images of Ni—F after collecting the Ni$_3$S$_2$@CNTs via ultrasonication for 5 minutes. It is apparent that most of the nanotubes were washed away during the ultrasonication process without any significant damage to the substrate. After drying off, the same substrate was reloaded with Ni NPs catalysts, and the synthesis was repeated under the same conditions.

The SEM images of the Ni—F substrate after regrowth of Ni$_3$S$_2$@CNTs are shown in FIGS. 8c and 8d. The re-grown Ni$_3$S$_2$@CNTs as seen in FIGS. 8c and 8d exhibit similar morphology to those in FIG. 6d. Also, no growth of Ni$_3$S$_2$@CNTs was observed in the second run if the substrate was not dip-coated with Ni catalyst particles. This confirms that Ni—F can assist the growth of Ni$_3$S$_2$@CNTs, but the actual catalyst particles responsible for the growth of Ni$_3$S$_2$@CNTs were Ni NPs. Also, the catalyst particles get completely exhausted during the synthesis process such that there is no excess of unreacted catalyst particles available in the substrate for the further growth of Ni$_3$S$_2$@CNTs.

Example 3—Microstructure of Ni$_3$S$_2$@CNTs

Figures 9A, 9B, 9C, 9D, 9E, 9F, 9G, 9H, 9I:
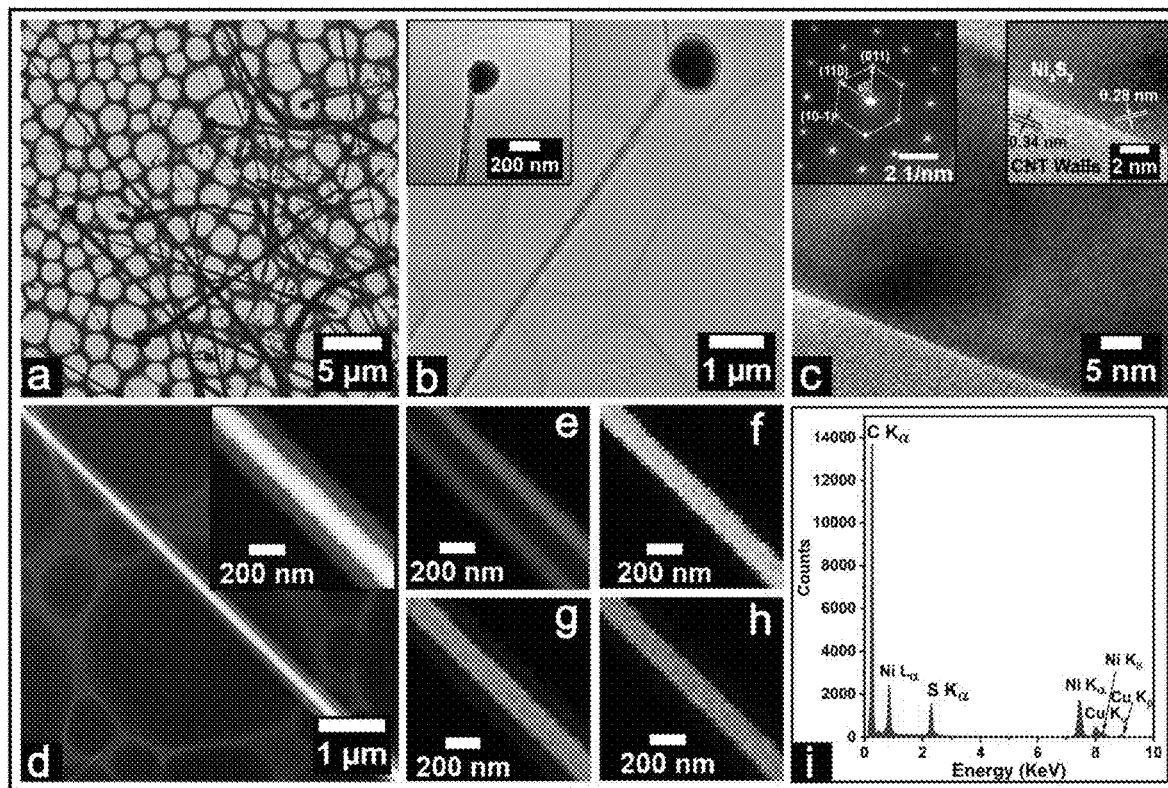
FIG. 9a is a transmission electron microscope (TEM) image showing complete and continuous filling of CNTs. The scale bar is 5 µm.
FIG. 9b is a TEM image showing an individual $Ni_3S_2$ filled CNT having a spherical root. The scale bar is 1 µm. The inset, with a scale bar of 200 nm, shows the closed tip structure.
FIG. 9c is a high resolution TEM image showing an individual $Ni_3S_2$ filled CNT. The scale bar is 5 nm. The insets show the selected area electron diffraction (SAED) pattern and lattice fringes.
FIG. 9d is a drift-correct scanning transmission electron microscope (STEM) image of an individual $Ni_3S_2$ filled CNT. The scale bar is 1 µm. The inset, with a scale bar of 200 nm, shows the high-angle annular dark-field imaging (HAADF)-STEM image.
FIG. 9e is an energy dispersive X-ray (EDX) image of elemental mapping of C—K; the scale bar is 200 nm.
FIG. 9f is an EDX image of elemental mapping of Ni—K; the scale bar is 200 nm.
FIG. 9g is an EDX image of elemental mapping of Ni-L; the scale bar is 200 nm.
FIG. 9h is an EDX image of elemental mapping of S—K; the scale bar is 200 nm.
FIG. 9i is the spectrum (counts versus energy (in kiloelectron Volts (KeV))) for C—K, Ni—K, Ni-L, and S—K.

FIGS. 9a-9c show transmission electron microscope (TEM) images of Ni$_3$S$_2$@CNTs synthesized using Ni NPs. It can be seen in FIG. 9a that the synthesis method is highly reliable to produce CNTs filled with Ni$_3$S$_2$ nanowires several micrometers long. Prior to the TEM studies, Ni$_3$S$_2$@CNTs were collected from the Ni—F using ultrasonication, which caused fragmentation of some of the Ni$_3$S$_2$@CNTs, but the majority of Ni$_3$S$_2$@CNTs remain intact. TEM examination showed that all CNTs are completely and continuously filled with Ni$_3$S$_2$ nanowires. FIG. 9b shows the lower resolution TEM image of an individual Ni$_3$S$_2$@CNT with a spherical root enclosed by several layers of carbon shells. Also, it can be seen in the inset of FIG. 9b that the Ni$_3$S$_2$@CNTs have their tips closed with the catalyst particles.

FIG. 9c shows the high resolution TEM image of a Ni$_3$S$_2$@CNT having a nanowire diameter of about 36 nm and carbon shell thickness of about 30 nm in each side. However, the thickness of nanotubes and nanowires may vary from one Ni$_3$S$_2$@CNT to another. A continuum of lattice planes can be seen on both sides of the CNT/Ni$_3$S$_2$ interface revealing a complete filling in the radial direction too. As shown in the inset (on the right of FIG. 9c), the interlayer spacing of the outer sheath is 0.34 nm, which matches with the (002) plane of graphitic carbon whereas the interlayer spacing of 0.28 nm of the filler core matches with the d-spacing of the (110) plane of rhombohedral Ni$_3$S$_2$ (heazlewoodite phase (a=5.745 A° and c=7.135 A°; space group R32 (155); ICDD reference card No: 00-044-1418)). The selected area electron diffraction (SAED) pattern obtained at the Ni$_3$S$_2$@CNT core shown in the inset on the left reveals that the filler Ni$_3$S$_2$ nanowire is single-crystalline. The spots could be indexed as (011), (110), and (10-1) planes of rhombohedral Ni$_3$S$_2$ along the [1-11] zone axis.

FIG. 9d shows the drift corrected scanning and transmission electron microscope (STEM) image taken at the middle section of a particular Ni$_3$S$_2$@CNT about 350 nm thick along with a nanowire diameter of about 130 nm whereas the inset shows the high-angle annular dark-field imaging (HAADF) STEM image of the same Ni$_3$S$_2$@CNT. The composition of the nanohybrid was examined using energy dispersive X-ray spectroscopy (EDX), and the elemental mapping of C—K, Ni—K, Ni-L, and S—K are shown in FIGS. 9e-9h, respectively. The corresponding EDS spectra in FIG. 9i plainly shows three peaks corresponding to Ni (K$_\alpha$ at 7.470 keV, K$_\beta$ at 8.262 keV and La at 0.851 keV) and a major K$_\alpha$ peak corresponding to S at 2.306 keV, whereas the peaks corresponding to Cu and C are from the TEM copper grid and the CNT walls, respectively. These results indicate that the synthesized materials are Ni$_3$S$_2$@CNTs. To further confirm the structure of the synthesized materials, X-ray diffraction and Raman spectroscopy were employed to examine the materials. In addition, the UV-Vis absorption property of the materials was studied.

Example 4—XRD and Raman Characterization of Ni$_3$S$_2$@CNTs

The crystal structure and phase composition of the Ni$_3$S$_2$ filler was further confirmed using XRD measurements on the powder sample collected from the Ni—F. The diffraction patterns marked with diamond symbols in FIG. 10a can be indexed as (101), (110), (003), (021), (113), (211), (104), (122), (131), (214), and (401) planes of rhombohedral Ni$_3$S$_2$ (ICDD reference card No: 00-044-1418), which correspond to the 2θ values of 21.75°, 31.10°, 37.77°, 38.27°, 49.73°, 50.12°, 54.61°, 55.16°, 69.27°, 73.04°, and 77.89° respectively. The (002) peak for the graphite can be clearly observed at 26.36° whereas the three peaks (111), (200), and (220) marked with star symbols represent the diffraction patterns of Ni corresponding to the 2θ values of 44.50°, 51.84°, and 76.36° respectively. The presence of the Ni peak in the XRD profile is probably from the residuals of Ni—F in the sample.

Figures 10A, 10B:
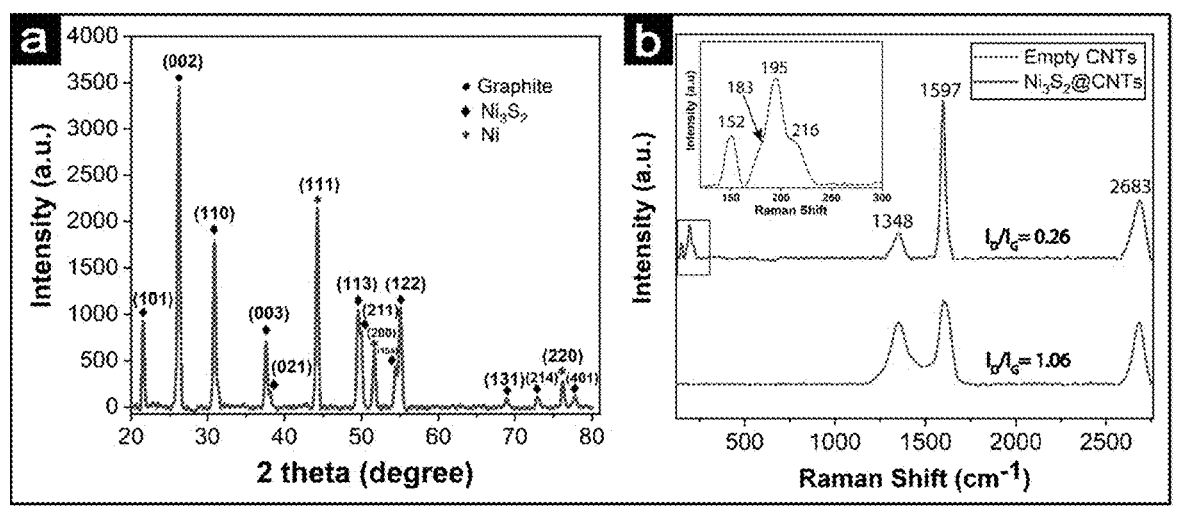
FIG. 10a is an X-ray diffraction (XRD) spectrum of $Ni_3S_2$ filled CNTs.
FIG. 10b is Raman spectra of empty CNTs (bottom curve with $I_D/I_G$=1.06) and $Ni_3S_2$ filled CNT (upper curve with $I_D/I_G$=0.26). The inset shows the Raman spectra of $Ni_3S_2$ filled CNTs at lower wavenumbers.

FIG. 10b shows the Raman spectra of empty multi-walled CNTs and Ni$_3$S$_2$@CNTs in a frequency range of 120-2750 cm$^{-1}$. The position of D (1348 cm$^{-1}$), G (1597 cm$^{-1}$), and G' (2683 cm$^{-1}$) bands for both samples are in good agreement with literature data for MWCNTs and other carbonaceous materials (see, e.g., DiLeo et al., Purity assessment of multiwalled carbon nanotubes by Raman spectroscopy, Journal of Applied Physics, 101 (2007) 064307, and Dorina et al., Raman Spectroscopy of Carbonaceous Materials: A Concise Review, Spectroscopy, 26 (2011) 42-47; both of which are hereby incorporated herein by reference in their entireties). G band features from CNTs are related to the E$_{2g}$ mode of graphite, which arises due to the vibrations of sp$^2$ bonded C atoms in a two-dimensional hexagonal lattice, whereas D band corresponds to the vibrations of sp$^3$ carbon containing impurities, broken sp$^2$ bonding in side walls, lattice distortion (symmetry breaking defects) in hexagonal graphitic layers as well as the doping effects. A very low I$_D$/I$_G$ ratio of 0.26 confirms that CNT shells of the Ni$_3$S$_2$@CNTs synthesized by the methods disclosed herein are very well graphitized and of ultra high crystallinity. No related art methods have achieved an I$_D$/I$_G$ ratio this low for filled multi-walled CNTs. Unlike empty CNTs, Ni$_3$S$_2$@CNTs show different Raman characteristics at lower frequencies due to the presence of Ni$_3$S$_2$ nanowire at the interior of CNTs. The Raman bands at 183, 195, and 216 cm$^{-1}$ shown in the inset of FIG. 10b match well with the known values of the Raman bands corresponding to the Raman active phonon modes of $Ni_3S_2$. The band observed at 152 cm$^{-1}$ is due to the stray light whereas the absence of other three bands of $Ni_3S_2$ at around 302, 320, and 348 cm$^{-1}$ can be due to their dependence on the laser excitation wavelength or any sort of nanotube-filler interaction. The XRD and Raman results further confirmed the structure and chemical compostions of $Ni_3S_2$@CNTs.

Example 5—UV-Vis Spectroscopy of $Ni_3S_2$@CNTs

Figures 11A, 11B:
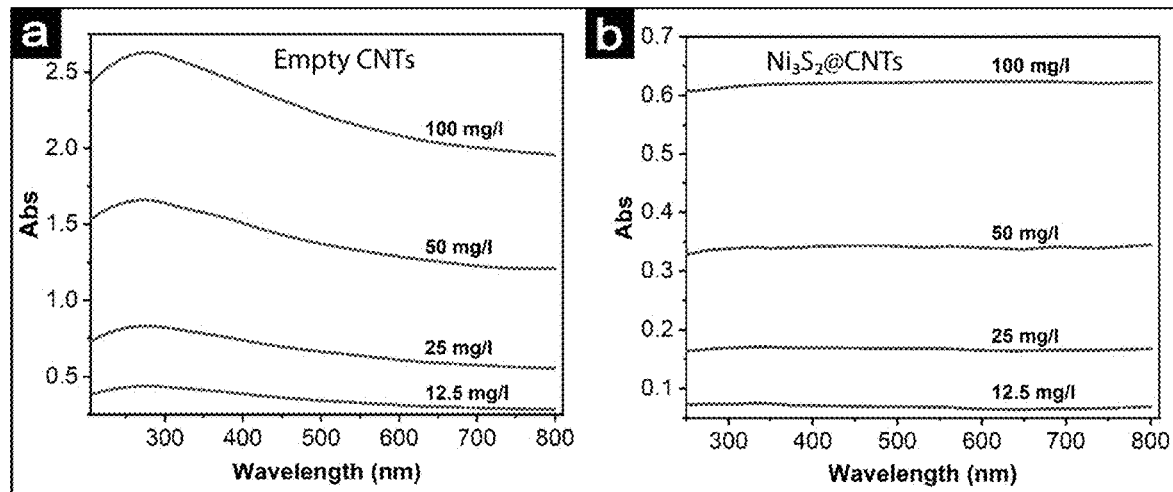
FIG. 11a is the UV-Vis a plot of the spectra of different concentrations of empty CNTs.
FIG. 11b is the UV-Vis a plot of the spectra of different concentrations of $Ni_3S_2$ filled CNTs.

The optical absorption properties of $Ni_3S_2$@CNTs were studied using UV-Vis spectroscopy, and the results are shown in FIGS. 11a and 11b. In the experiment, empty CNTs and $Ni_3S_2$@CNTs were dispersed in ethanol to make samples with four different concentrations of 12.5, 25, 50, and 100 mgl$^{-1}$. The dispersions were kept in an ultrasonication bath for 30 mins to make them uniform and the UV-Vis spectra were recorded immediately. A broad absorption peak at 276 nm along with a gradual decrease with increasing wavelength for empty CNTs (FIG. 11a) is in well agreement with the UV-Vis characteristics of empty multi-walled CNTs reported. Such absorption feature arises due to the collective oscillation of free electron gas (it-plasmons) in the conduction band of CNTs. However, $Ni_3S_2$@CNTs showed different UV-Vis characteristics due to the interactive effects between the CNT shells and $Ni_3S_2$ filler. FIG. 11b shows that the broad peak due to the it-plasmons resonance has vanished, and the absorption is almost independent on the wavelength of incident light. The reason behind this situation can be explained by a charge transfer process that can occur from the CNT shells to the $Ni_3S_2$ filler.

Figure 12:
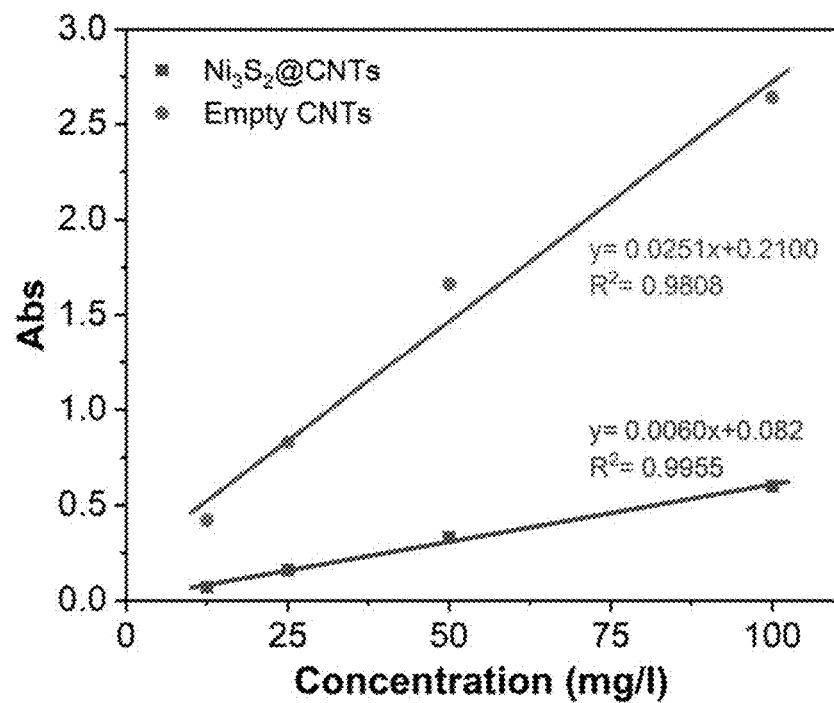
FIG. 12 is a plot of absorption versus concentration (in milligrams per liter (mg/l)) for empty CNTs at ultraviolet 276 nm (the higher line with circular data points) and $Ni_3S_2$ filled CNTs (the lower line with square data points).
Figures 13A, 13B, 13C, 13D:
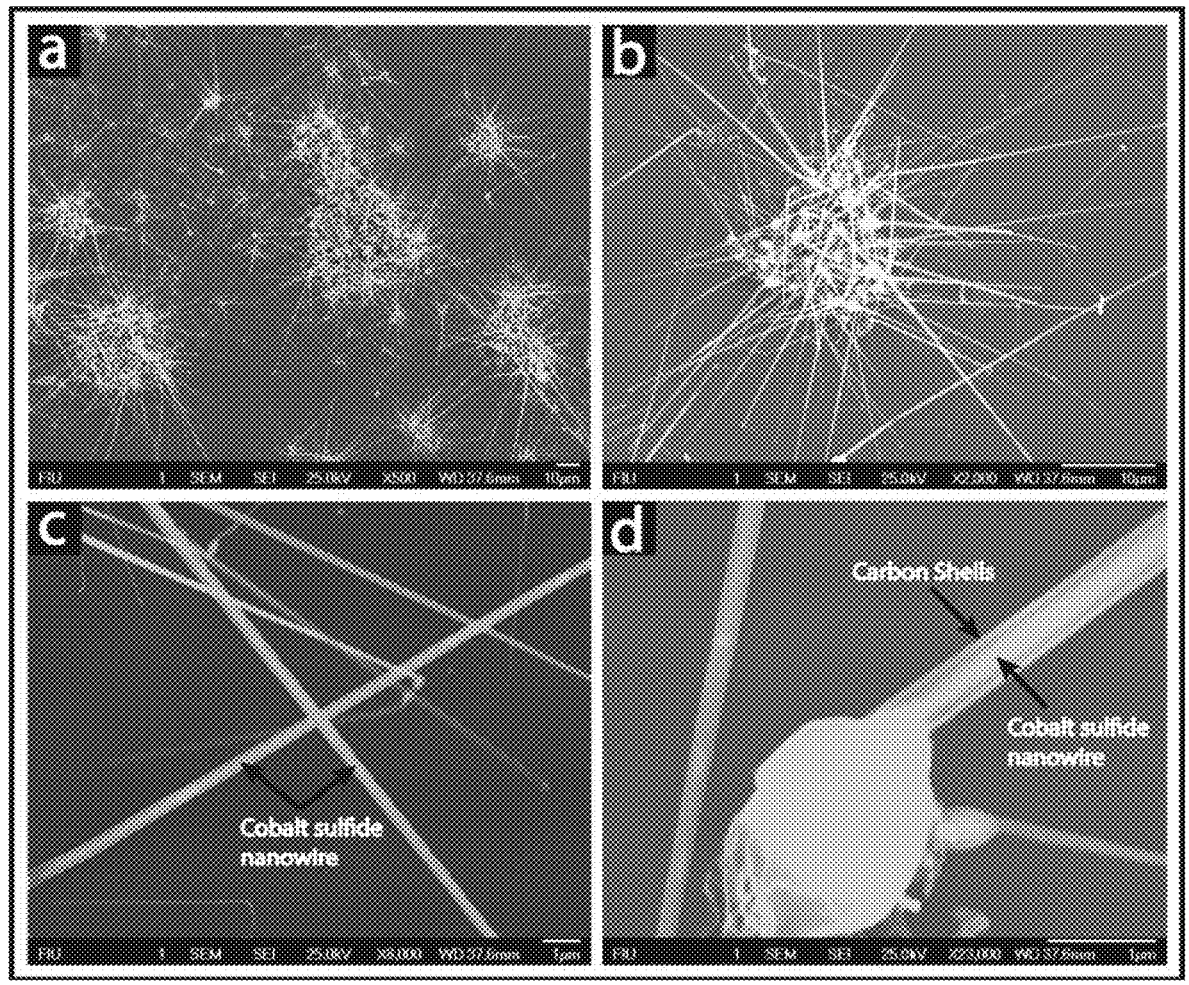
FIG. 13a is an SEM image of cobalt sulfide nanowires filled in CNTs ($Co_9S_8$ filled CNTs) synthesized using cobalt nanoparticles on a silicon substrate. The scale bar is 10 µm.
FIG. 13b is an SEM image of $Co_9S_8$ filled CNTs synthesized using cobalt nanoparticles on a silicon substrate. The scale bar is 10 µm.
FIG. 13c is an SEM image of $Co_9S_8$ filled CNTs synthesized using cobalt nanoparticles on a silicon substrate. The scale bar is 1 µm.
FIG. 13d is an SEM image of $Co_9S_8$ filled CNTs synthesized using cobalt nanoparticles on a silicon substrate. The scale bar is 1 µm.

A negative shift can occur in the binding energy of S $2P_{3/2}$ spectrum of $Ni_3S_2$ after covering it with graphene layer along with the existence of C—S bond in the C is spectrum, revealing the electron transfer from graphene to $Ni_3S_2$. In addition to the unique absorption properties of $Ni_3S_2$@CNTs, a linear dependence of absorption on the concentration of both empty and filled CNTs was also found (shown in FIG. 12), which is in compliance with Beer-Lambert law. A fairly constant value of absorption at all wavelengths for each concentration of $Ni_3S_2$@CNTs suggests that the molar absorption coefficient (c) of $Ni_3S_2$@CNTs is independent of the energy of radiation in the UV-Vis region.

Example 6—Synthesis of Cobalt Sulfide Nanowires Filled Carbon Nanotubes ($Co_9S_8$@CNTs) Using Cobalt Metal Nanoparticles Commercial cobalt nanoparticles (Co, 99.8%, 28 nm) were used as catalyst to synthesize $Co_9S_8$@CNTs on silicon substrates. The synthesis method was generally the same as that in Example 2.

The SEM images of the synthesized $Co_9S_8$@CNTs are shown in FIGS. 13a-13d. The morphology of the cobalt sulfide filled CNTs (e.g., spherical roots, linear and tapered structure, and catalyst particle attached at the tip) as seen in FIGS. 13a-13d indicate that they have a similar structure as those of $Ni_3S_2$@CNTs. The CNTs shown in FIGS. 13a-13d are completely and continuously filled with cobalt sulfide nanowires several micrometers long. The presence of continuous cobalt sulfide nanowires at the CNT cores can be plainly observed in FIGS. 13c and 13d. This method can also be applicable to synthesize cobalt sulfide nanowires filled CNTs on metal foam substrates. Further examination showed that cobalt sulfide filler is $Co_9S_8$ with cubic crystal structure, and that is why the cobalt sulfide nanowires filled carbon nanotubes are denoted as $Co_9S_8$@CNTs.

Example 7—Synthesis of $Co_9S_8$@CNTs Using Cobalt Salt

Cobalt salt $Co(NO_3)_2 \cdot 6H_2O$ was used as precursor to synthesize $Co_9S_8$@CNTs on silicon substrates. The synthesis method was generally the same as that in Example 1. The results were similar to those seen in FIGS. 13a-13d for Example 6.

Example 8—Synthesis of Iron Sulfide Nanowires Filled Carbon Nanotubes ($Fe_xS_y$@CNTs) Using Iron Metal Nanoparticles Commercial iron nanoparticles (Fe, 99.5+%, 35-45 nm) were used as catalyst to synthesize $Fe_xS_y$@CNTs on nickel foam. The synthesis method was generally the same as that in Example 2.

Figures 14A, 14B, 14C, 14D:
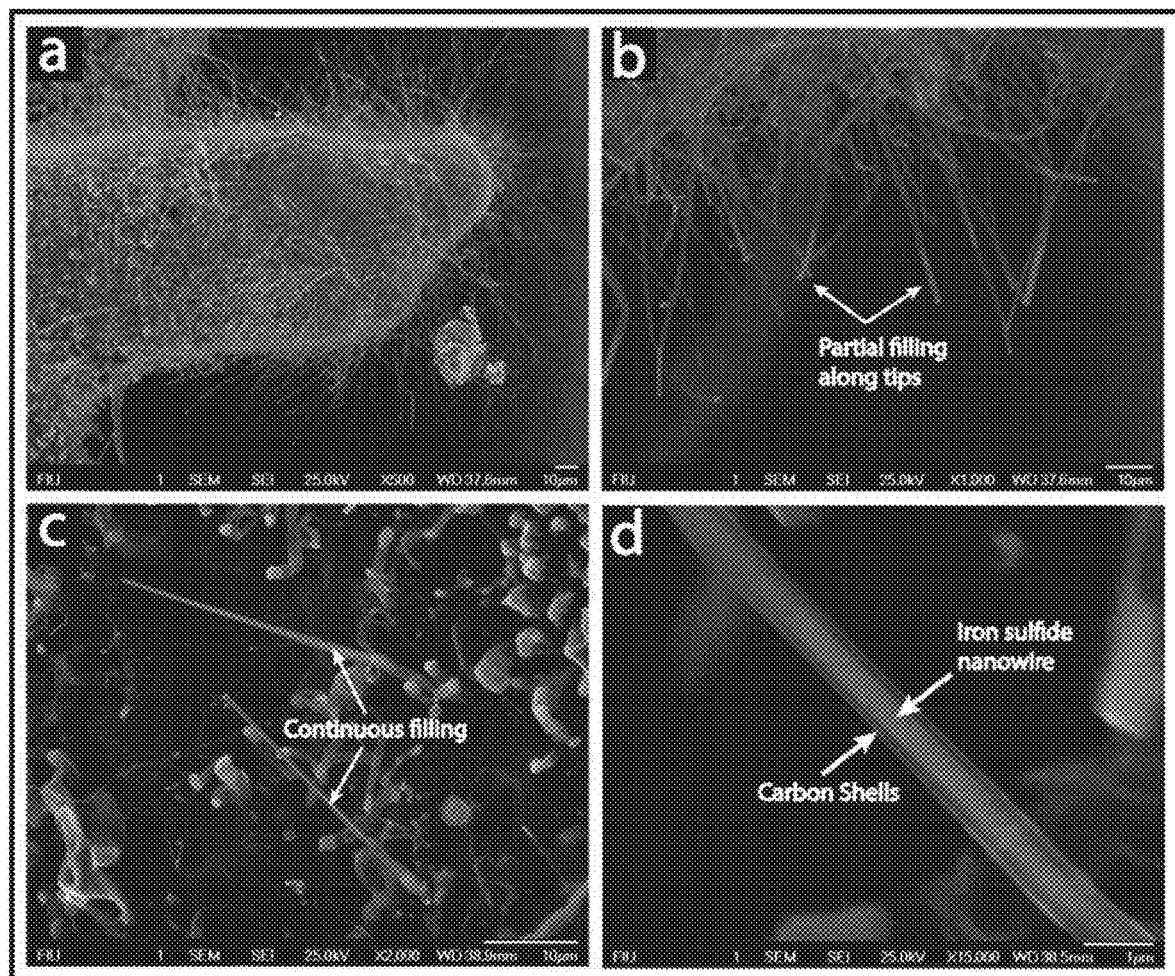
FIG. 14a is an SEM image of iron sulfide nanowires filled in CNTs ($Fe_xS_y$ filled CNTs) synthesized using iron nanoparticles on a Ni—F substrate. The scale bar is 10 µm.
FIG. 14b is an SEM image of $Fe_xS_y$ filled CNTs synthesized using iron nanoparticles on a Ni—F substrate. The scale bar is 10 µm.
FIG. 14c is an SEM image of $Fe_xS_y$ filled CNTs synthesized using iron nanoparticles on a Ni—F substrate. The scale bar is 10 µm.
FIG. 14d is an SEM image of $Fe_xS_y$ filled CNTs synthesized using iron nanoparticles on a Ni—F substrate. The scale bar is 1 µm.

The SEM images of the synthesized $Fe_xS_y$@CNTs are shown in FIGS. 14a-14d. The morphology of iron sulfide filled CNTs grown at the edges of Ni foam layers (FIGS. 14a and 14b) is slightly different than that of nickel or cobalt sulfide filled CNTs due to their partial filling. It is evident from FIG. 14b that CNTs are partially filled with iron sulfide nanowires about 10 µm length along their tips. However, in some CNTs lying at the top surface of the substrate, it was observed that their cores were continuously filled with longer iron sulfide nanowires as shown in FIG. 14c. Further, a clear distinction of the filled core-shell structure of iron sulfide filled CNTs can be observed in the high magnification SEM image shown in FIG. 14d. This method can also be used to synthesize iron sulfide filled CNTs on two-dimensional substrates including but not limited to silicon or quartz. The filler inside the CNTs was confirmed as iron sulfide, and that is why these filled CNTs are denoted as $Fe_xS_y$@CNTs.

Example 9—Synthesis of $Fe_xS_y$@CNTs Using Iron Salt

Iron salt $Fe(NO_3)_3 \cdot 9H_2O$ was used as precursor to synthesize $Fe_xS_y$@CNTs on silicon substrates. The synthesis method was generally the same as that in Example 1. The results were similar to those seen in FIGS. 14a-14d for Example 8.

Example 10—Synthesis of Metal Sulfide Nanowire Filled Single-Walled CNTs

Figure 15:
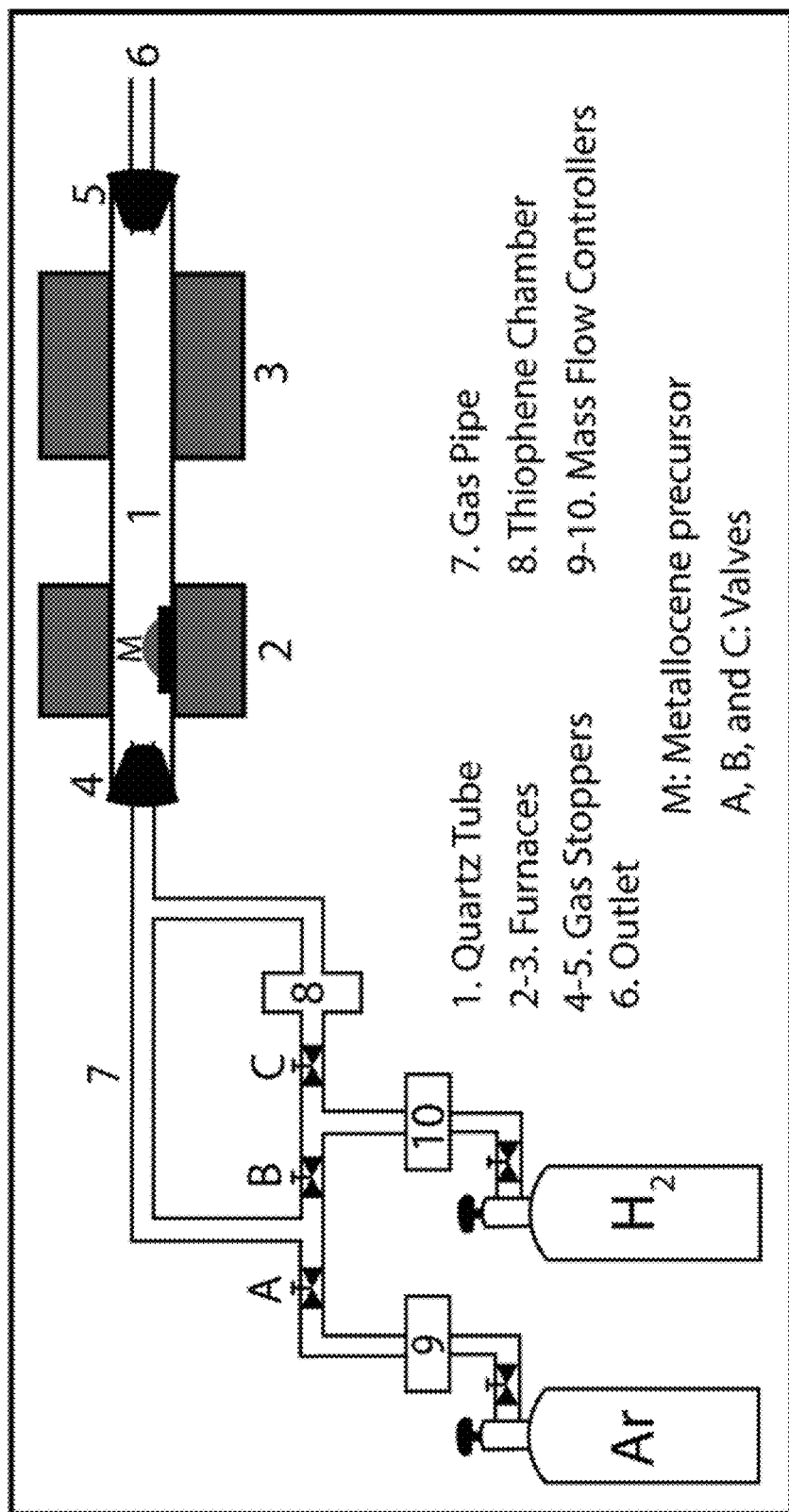
FIG. 15 is a schematic view of a setup for in situ synthesis of filled single-walled carbon nanotubes (SWCNTs) using a floating catalyst chemical vapor deposition technique, according to an embodiment of the subject invention.

The narrow diameter possessed by single-walled carbon nanotubes (SWCNTs) not only causes their aspect ratio to be much higher than that of multi-walled carbon nanotubes (MWCNTs) but also forces the encapsulated materials to adopt a true one-dimensional morphology. New properties, phases, structures and behaviors of the filled CNTs can emerge as their cavity diameter becomes very small such as in SWCNTs. The in situ filling of SWCNTs with metal sulfides (e.g., nickel sulfide, cobalt sulfide, and iron sulfide) can be achieved using a similar process described in Examples 1, 2, and 6-9 along with some modification in the precursor and the experimental set up. A floating catalyst chemical vapor deposition (FCCVD) technique can be employed to fill the SWCNT cores with atomically thin nanowires of metal sulfides. Metallocene (e.g., nickelocene, cobaltocene, or ferrocene) can be used as the catalyst precursor, which can release tiny metal catalyst nanoparticles during their sublimation. Importantly, a sulfur containing chemical such as thiophene ($C_4H_4S$) can be used as both the carbon source and sulfur source to guarantee both the growth of the SWCNTs and their in situ filling by metal sulfides nanowires. The in situ FCCVD can allow large scale production of metal sulfide filled SWCNTs. FIG. 15 shows a schematic representation of the in situ FCCVD method that can be used to synthesize metal sulfide filled SWCNTs.

A certain amount (e.g., 10-20 mg) of metallocene (e.g., nickelocene, cobaltocene, or ferrocene) powder (M) can be placed on a quartz boat inside a quartz tube. Ar gas can be passed into the chamber at a flow rate of, e.g., 80-200 sccm for 10 mins by closing valves B and C so as to create an inert atmosphere inside the reaction tube. With the Ar continuing to flow at the same rate, the temperature of the furnace (#2) can be raised to and maintained at 100-200° C. so that the sublimation of metallocene powder can proceed. Valve B can then be opened to pass $H_2$ gas at a flow rate of, e.g., 80-200 sccm, which will reduce the vaporized metallocene to form metal atoms and subsequently agglomerate into metal nanoparticles. The temperature of the second furnace (#3) can be maintained at 850-1200° C., and the catalyst vapor can be fed into the synthesis zone of the Furnace (#3) by increasing the Ar flow rate significantly (e.g., to 1500-1900 sccm). During a typical synthesis time of 10-30 mins, the direction of $H_2$ gas flow can be switched from valve B to C so that it bubbles through thiophene and passes into the tube. Thus, the thiophene vapor will be carried into the reaction chamber, and a proper sulfidation reaction can occur resulting in the simultaneous growth and filling of SWCNTs with metal sulfide nanowires. The final product is of a macroscale of SWCNTs filled with metal sulfide nanowires either in form of a web-like thin material or a thick nonwoven material formed at the rear side of the quartz tube.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A compound comprising:
a plurality of carbon nanotubes (CNTs); and
a nanowire of a metal sulfide respectively filled in each CNT,
an average filling ratio, across all of the CNTs present in the compound, of the metal sulfide being at least 0.90,
the CNTs having an average length of at least 5 μm,
each CNT filled with the respective nanowire being straight from a first end thereof to a second end thereof, and
the first end and the second end of each CNT filled with the respective nanowire being closed with carbon shells.

2. The compound according to claim 1, the metal sulfide being nickel sulfide, cobalt sulfide, or iron sulfide.

3. The compound according to claim 1, the metal sulfide being $Ni_3S_2$.

4. The compound according to claim 3, the CNTs having an average filling ratio of at least 0.95.

5. The compound according to claim 3, the CNTs having an average filling ratio of at least 0.98.

6. The compound according to claim 1, the metal sulfide being $Co_9S_8$.

7. The compound according to claim 1, the metal sulfide being iron sulfide.

8. The compound according to claim 1, each CNT being a multi-walled CNT.

9. The compound according to claim 1, the CNTs having an average filling ratio of at least 0.95.

10. The compound according to claim 1, the CNTs having an average filling ratio of at least 0.98.

11. The compound according to claim 1, the CNTs having an average filling ratio of at least 0.99.

12. The compound according to claim 2, each CNT of the plurality of CNTs having a filling ratio of 1.0.

13. The compound according to claim 1, the CNTs having an average length of at least 7 μm.

14. The compound according to claim 1, the CNTs having an average length of at least 10 μm.

15. The compound according to claim 1, the CNTs having an average length of at least 20 μm.

16. The compound according to claim 1, the CNTs having an average length of at least 30 μm.

17. The compound according to claim 1, each CNT of the plurality of CNTs having a filling ratio of 1.0.

18. A compound comprising:
a plurality of carbon nanotubes (CNTs); and
a nanowire of a metal sulfide respectively filled in each CNT,
an average filling ratio, across all of the CNTs present in the compound, of the metal sulfide being at least 0.98,
the CNTs having an average length of at least 5 μm,
each CNT filled with the respective nanowire being straight from a first end thereof to a second end thereof, and
the first end and the second end of each CNT filled with the respective nanowire being closed with carbon shells,
the metal sulfide being $Ni_3S_2$, and
each CNT being a multi-walled CNT.

19. The compound according to claim 18, the CNTs having an average filling ratio of at least 0.99.

20. The compound according to claim 18, each CNT of the plurality of CNTs having a filling ratio of 1.0.

* * * * *